(12) United States Patent
Raaijmakers et al.

(10) Patent No.: US 6,544,900 B2
(45) Date of Patent: Apr. 8, 2003

(54) IN SITU DIELECTRIC STACKS

(75) Inventors: Ivo Raaijmakers, Bilthoven (NL); Christiaan Werkhoven, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/992,215

(22) Filed: Nov. 14, 2001

(65) Prior Publication Data

US 2002/0052124 A1 May 2, 2002

Related U.S. Application Data

(63) Continuation of application No. 09/471,761, filed on Dec. 23, 1999, now Pat. No. 6,348,420.

(51) Int. Cl.[7] .................. H01L 21/31; H01L 21/469
(52) U.S. Cl. ............................................ 438/769
(58) Field of Search ................... 438/680, 769, 438/770, 775, 786, 788, 791; 427/8, 39, 99, 248

(56) References Cited

U.S. PATENT DOCUMENTS

| | | |
|---|---|---|
| 3,926,715 A | 12/1975 | Süssman |
| 3,943,015 A | 3/1976 | Ing |
| 4,477,311 A | 10/1984 | Mimura et al. |
| 4,764,248 A | 8/1988 | Bhattacherjee et al. |
| 4,789,645 A | 12/1988 | Calviello et al. |
| 4,820,378 A | 4/1989 | Loewenstein |
| 4,859,617 A | 8/1989 | Nomoto et al. |
| 4,872,947 A | 10/1989 | Wang et al. |
| 4,906,328 A | 3/1990 | Freeman et al. |
| 4,913,929 A | 4/1990 | Moslehi et al. |
| 5,067,437 A | 11/1991 | Watanabe et al. |
| 5,072,263 A | 12/1991 | Watanabe et al. |
| 5,138,973 A | 8/1992 | Davis et al. |
| 5,192,410 A | 3/1993 | Ito et al. |
| 5,204,288 A | 4/1993 | Marks et al. |
| 5,354,715 A | 10/1994 | Wang et al. |
| 5,360,769 A | 11/1994 | Thakur et al. |
| 5,374,570 A | 12/1994 | Nasu et al. |
| 5,376,593 A | 12/1994 | Sandhu et al. |
| 5,393,683 A | 2/1995 | Mathews et al. |
| 5,482,739 A | 1/1996 | Hey et al. |
| 5,488,497 A | 1/1996 | Takanashi et al. |
| 5,492,854 A | 2/1996 | Ando |
| 5,504,029 A | 4/1996 | Murata et al. |
| 5,508,067 A | 4/1996 | Sato et al. |
| 5,591,494 A | 1/1997 | Sato et al. |
| 5,968,587 A | 10/1999 | Frankel |
| 6,167,834 B1 | 1/2001 | Wang et al. |

OTHER PUBLICATIONS

Abeles et al., "Amorphous Semiconductor Superlattices," *Physical Review Letters*, vol. 51, No. 21, pp. 2003–2006 (1983).

(List continued on next page.)

*Primary Examiner*—Matthew Smith
*Assistant Examiner*—Calvin Lee
(74) *Attorney, Agent, or Firm*—Knobbe, Martens, Olson & Bear, LLP.

(57) ABSTRACT

Multiple sequential processes are conducted in situ in a single-wafer processing chamber, particularly for forming ultrathin dielectric stacks of high quality. The chamber exhibits single-pass, laminar gas flow, facilitating safe and clean sequential processing. Furthermore, a remote plasma source widens process windows, permitting isothermal sequential processing and thereby reducing the transition time for temperature ramping between in situ steps. In exemplary processes, extremely thin interfacial silicon oxide, nitride and/or oxynitride is grown, followed by in situ silicon nitride deposition. Cleaning, anneal and electrode deposition can also be conducted in situ, reducing transition time without commensurate loss in reaction rates.

45 Claims, 10 Drawing Sheets

OTHER PUBLICATIONS

Brady et al., "*Development of Silicon Nitride Films for Gate Dielectric Applications*," Abstract No. 140, *Meeting Abstracts: The 195th Meeting of the Electrochemical Society, Inc.,*, vol. 99–1, May 1999.

Hu, et al., "*Thin Gate Oxides Promise High Reliability,*" *Semiconductor International*, Jul. 1998, pp. 215–222.

Kim, et al., "*Ultra Thin (<3 nm) High Quality Nitride/Oxide Stack Gate Dielectrics Fabricated by In–Situ Rapid Thermal Processing*," IEDM 97–463, 1997, *IEEE*, pp. 18.2.118.2.4.

Landheer, "*Properties of gate–quality silicon nitride and oxynitride dielectrics deposited using an electron cyclotron––resonance plasma source*", Abstract No. 129, *Meeting Abstracts: The 195th Meeting of the Electrochemical Society, Inc.*, vol. 99–1, May 1999.

Leonarduzzi, et al., "*Improvising Performance with Oxynitride Gate Dielectrics; Inclusion of nitrogen in the transistor's gate provides optimal device performance,*" *Semiconductor International*, Jul. 1998, pp. 225–230.

Reid et al., "*Dilute Steam Rapid Thermal Oxidation for 30A Gate Oxides*," Abstract No. 489, *Meeting Abstracts: The 195th Meeting of the Electrochemical Society, Inc.*, vol. 99–1, May 1999.

Sakaue et al., "*Digital Chemical Vapor Deposition of $SiO_2$ Using the Repetitive Reaction of Triethylsilane/Hydrogen and Oxidation,*" *Japanese Journal of Applied Physics*, vol. 30, No. 1B, pp. L124–L127 (1990).

Thakur et al., "*Ultrathin Gate and Capacitor Dielectric Formation Using Single–Wafer Processing,*" *Mat. Res. Soc. Symp. Proc.*, vol. 303, 1993, pp. 401–406.

IN SITU DIELECTRIC STACKS

REFERENCE TO RELATED APPLICATION

This application is a continuation of application Ser. No. 09/471,761, filed Dec. 23, 1999, now U.S. Pat. No. 6,348,420. Amendments made to the specification of this application are the same as those made to the specification of the referenced parent application.

BACKGROUND OF THE INVENTION

1. Field of the Invention

The present invention relates generally to methods and equipment for forming dielectric stacks in integrated circuits, and particularly to in situ processing in the formation of dielectric stacks.

2. Description of the Related Art

High-temperature ovens, called reactors, are used to create structures of very fine dimensions, such as integrated circuits on semiconductor substrates. One or more substrates, such as silicon wafers, are placed on a wafer support inside the reaction chamber. Both the wafer and support are heated to a desired temperature. In a typical wafer treatment step, reactant gases are passed over the heated wafer, causing the chemical vapor deposition (CVD) of a thin layer on the wafer. Various process conditions, particularly temperature uniformity and reactant gas distribution, must be carefully controlled to ensure a high quality of the resulting layers.

Through a series of deposition, doping, photolithography and etch steps, the starting substrate and subsequent layers are converted into integrated circuits, with a single substrate producing from tens to thousands or even millions of integrated devices, depending on the size of the wafer and the complexity of the circuits.

Batch processors have traditionally been employed in the semiconductor industry to allow simultaneous processing of multiple wafers, thus economically presenting low processing times and costs per wafer. Recent advances in miniaturization and attendant circuit density, however, have lowered tolerances for imperfections in semiconductor processing. Accordingly, single wafer processing reactors have been developed for improved control of deposition conditions.

Among other process parameters, single wafer processing has greatly improved temperature and gas flow distribution across the wafer. In exchange for greater process control, however, processing time has become even more critical than with batch systems. Every second added to processing times must be multiplied by the number of wafers being processed serially, one at a time, through the same single-wafer processing chamber. While moving to larger wafers (e.g., from 200 mm to 300 mm wafers) improves throughput by packing more chips onto a single wafer, tolerance for yield loss is commensurately reduced due to the increased expense of each wafer. Conversely, any improvements in wafer throughput and/or yield can translate to significant fabrication cost savings.

One area in which process control is particularly critical is the fabrication of transistor gate dielectrics. In the pursuit of ever faster and more efficient circuits, semiconductor designs are continually scaled down with each product generation. Transistor switching time plays a large role in the pursuit of faster circuit operation. Switching time, in turn, can be reduced by reducing the channel length of the transistors. In order to realize maximum improvements in transistor performance, vertical dimensions should be scaled along with horizontal dimensions. Accordingly, effective gate dielectric thickness, junction depth, etc. will all decrease with future generation integrated circuits.

Conventional gate dielectrics are formed of high quality silicon dioxide and are typically referred to as "gate oxide" layers. Ultra thin gate oxides (e.g., less than 5 nm), however, have been found to exhibit high defect densities, including pinholes, charge trapping states, and susceptibility to hot carrier injection effects. Such high defect densities lead to leakage currents through the gate dielectric and rapid device breakdown unacceptable for circuit designs with less than 0.25 $\mu$m gate spacing, i.e., sub-quarter-micron technology.

While care under laboratory conditions can be used to control defect densities, such control has been difficult to achieve under commercial volume fabrication conditions. Moreover, even if the integrity of the oxide is perfectly maintained, quantum-mechanical effects set fundamental limits on the scaling of gate oxide. At high fields, direct tunneling dominates over Fowler-Nordheim tunneling, and largely determines oxide scaling limits. These scaling limits have been estimated at about 2 nm for logic circuits, and about 3 nm for more leakage-sensitive memory arrays in dynamic random access memory (DRAM) circuits. See, e.g., Hu et al., "Thin Gate Oxides Promise High Reliability," SEMICONDUCTOR INTERNATIONAL (July 1998), pp. 215–222.

Theoretically, incorporating materials of higher dielectric constant into the gate dielectric opens the door to further device scaling. Due to higher dielectric constant, a silicon nitride layer, for example, can exhibit the same capacitance as a thinner silicon dioxide layer, such that a lower equivalent oxide thickness can be achieved without tunnel-limited behavior. Another advantage of silicon nitride is its diffusion barrier properties, resisting boron penetration.

On the other hand, silicon nitride has been found to exhibit a higher density of defects, such as interface trapping states, as compared to oxides. One solution to the individual shortcomings of oxides and nitrides is to produce a hybrid layer. Incorporation of nitrogen into oxide, to form silicon oxynitride dielectric layers, has been found to improve the quality of gate dielectrics. See, e.g,. Leonarduzzi & Kwong, "Improving Performance with Oxynitride Gate Dielectrics," SEMICONDUCTOR INTERNATIONAL (July 1998), pp. 225–230. This solution, however, results in a compromise in dielectric characteristics, exhibiting a lower effective dielectric constant as compared to a full silicon nitride gate dielectric.

Forming silicon nitride over thin oxide layers, however, has been found to reduce defect densities while considerably lowering overall gate dielectric equivalent oxide thickness. See, e.g., Kim et al., "Ultra Thin (<3 nm) High Quality Nitride/Oxide Stack Gate Dielectrics Fabricated by In-Situ Rapid Thermal Processing," IEDM 97 (1997), pp. 463–466.

While nitride/oxide bilayers and oxynitride gate dielectric structures have proven promising in theoretical studies, incorporation into commercially viable process flows has been more difficult to achieve. Conventional processing technology has yet to satisfactorily achieve the high quality, defect-free layers required of ultrathin gate dielectrics with acceptable yield. Moreover, the increased complexity of multiple processing steps for formation of gate dielectric stacks significantly reduces wafer throughput and thereby increases fabrication costs.

Similar integration and cost problems have plagued another area in which high quality, thin dielectric layers are desirable. Integrated capacitors in memory arrays must exhibit a certain minimum capacitance for proper data storage and retrieval. As the chip area or "footprint" available per memory cell shrinks with each progressive generation of integrated circuits, the required capacitance per unit of footprint has increased. Many complex folding structures have been proposed for increasing capacitance through increased capacitor electrode surface area for a given cell footprint. Often, these structures require extremely complex fabrication steps, increasing the cost of processing significantly.

Other efforts to increase capacitance for a given memory cell space have focused on the use of materials characterized by high dielectric constants (high k materials). Certain metal oxides, such as barium strontium titanate (BST), strontium bismuth tantalate (SBT), tantalum oxide ($Ta_2O_5$), etc., exhibit high permittivity (k) and are thus promising for increasing capacitance. Integration of such materials into current process flows, however, has been challenging due to the relative instability of high k materials, a tendency to exhibit high defect densities, and the reduced benefit of high k materials in combination with native oxide over conventional electrodes.

A need exists, therefore, for effective methods of forming high quality dielectric layers. Desirably, such methods should be compatible with single-wafer processing systems and sub-quarter-micron technology, yet exhibit higher yield and throughput compared to conventional techniques.

SUMMARY OF THE INVENTION

In accordance with one aspect of the invention, a process is provided for forming a gate dielectric stack in an integrated transistor. The method includes loading a substrate with a semiconductor structure into a single substrate processing chamber. A first oxide layer grows on a surface of the semiconductor structure within the chamber by exposure to a first gas reactive with the semiconductor structure. A silicon nitride layer is deposited in the same chamber over the thermal oxide layer.

In accordance with another aspect of the invention, a process is provided for forming a gate dielectric stack for an integrated transistor. A first dielectric layer is grown from a semiconductor substrate in a single-substrate processing chamber. A second dielectric layer is deposited over the first dielectric layer without removing the substrate from the processing chamber.

In accordance with still another aspect of the invention, a method is described for forming an integrated transistor gate on a semiconductor substrate. The method includes growing an oxide layer from the substrate at a first temperature. A silicon nitride layer is then deposited over the oxide layer at a second temperature, the second temperature within about ±50° C. of the first temperature.

In accordance with still another aspect of the invention, a method is provided for sequential processing in a single chamber to partially fabricate an integrated circuit. The method includes selecting a plurality of processing steps and a sequence to conduct the plurality of steps upon a substrate within the same chamber. A temperature is selected for a base process from among the plurality of steps. The substrate is loaded a substrate into the chamber. The base process is conducted upon the substrate. A plasma is generated remotely, providing an excited species to the substrate during at least one of the plurality of the steps immediately preceding or immediately subsequent the base process in the selected sequence.

In accordance with another aspect of the invention, a process is described for conducting a plurality of in situ integrated circuit fabrication steps. The process includes mounting a substrate within a process chamber. A remotely generated plasma product is supplied to the mounted substrate in a first substrate treatment step. A first step is conducted at a first temperature. A second substrate treatment step is then conducted at a second temperature within about ±50° C. of the first temperature, without removing the substrate from the chamber and without the remotely generated plasma product.

BRIEF DESCRIPTION OF THE DRAWINGS

These and further aspects of the invention will be readily apparent to the skilled artisan from the following description and the attached drawings, wherein.

DETAILED DESCRIPTION OF THE PREFERRED EMBODIMENT

Figure 1:
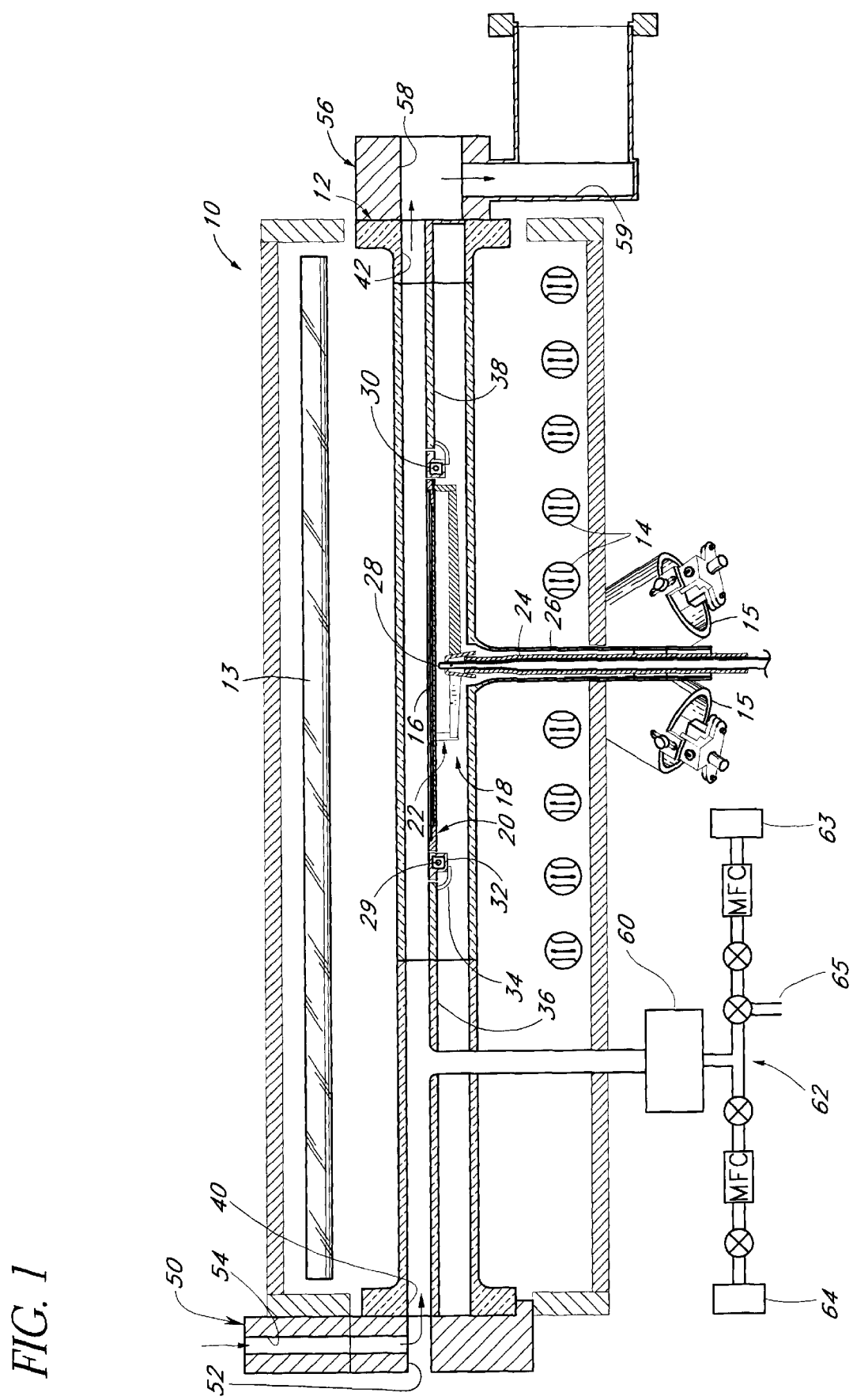
FIG. 1 is a schematic sectional view of an exemplary single-substrate reaction chamber.

As set forth in detail below, the present disclosure provides methods of fabricating integrated circuits in which multiple processing steps are conducted in situ, that is, without removing the substrate from the process chamber between steps. "In situ," as used herein, refers to sequential processes conducted in the same process chamber, and is not meant to encompass sequential processes conducted in multiple chambers within a cluster platform environment. In general, in situ sequential processing is desirable for reducing processing time, and for minimizing exposure of the wafer to particulates and oxygen outside the controlled process chamber environment.

As previously noted, single wafer processing achieves superior process control at the considerable expense of decreased substrate throughput, in comparison to batch processing systems. In situ sequential processing, on the other hand, tends to compromise the very goals of high purity and strict process control.

Under conventional operating conditions, a single-substrate processing chamber is regularly cleaned between process steps, particularly after deposition steps. For example, deposition processes involving a form of silane (e.g., silane, dichlorosilane or DCS, trichlorosilane or TCS) typically leave considerable residue on the chamber surfaces. Cold surfaces attract condensation of reactants, while hot surfaces cause decomposition of reactants. Residue from either source coats the process chamber walls, leading to particulate contamination from flaking and non-uniform processing conditions. For example, the residue will absorb energy from radiant heat lamps, upsetting a delicate balance in the relationship among heaters, heat sensors, and placement of components in the chamber. After the deposition step is complete, therefore, the substrate is removed from the chamber, and corrosive vapor etchants are introduced to clean the chamber surfaces before the next substrate is loaded, thus maintaining the processing environment in its intended state.

Such powerful etch cleaning steps, of course, cannot be conducted while the substrate remains mounted in the chamber, and thus cannot be conducted between steps in an in situ process flow. By exposing the chamber to multiple fabrication processes without removing the substrate, residue from one process remains in the chamber through the next process. Moreover, both the substrate and chamber are exposed to multiple reactants in series, some of which are chemically incompatible with one another. When the reactants or by-products of a first process encounter the reactants or by-products of a second process, the chamber and subsequently processed wafers can be subjected to impurities. Additionally, processing conditions, such as temperature uniformity across the wafer, can be adversely affected by these reactions, which in turn affects the uniformity of substrate treatment, whether it be etching, deposition or simple anneal.

The inventors have determined, however, that adverse effects of in situ processing can be avoided by appropriate control of process conditions. Significantly, the processes disclosed below minimize both contamination and transition time between sequential processes, boosting both yield and wafer throughput for single wafer processing.

Flowing reactants in a single-pass, laminar flow has been found particularly advantageous for the disclosed in situ sequential processing. The preferred reactor is first described below.

Preferred Reactor

While the preferred embodiments are presented in the context of a single-substrate, horizontal flow cold-wall reactor, it will be understood that certain aspects of the invention will have application to reactors of other types. The illustrated single-pass horizontal flow design enables laminar flow of reactant gases, with low residence times, which in turn facilitates sequential processing while minimizing reactant interaction with each other and with chamber surfaces. Thus, among other advantages, such a laminar flow enables sequentially flowing reactants that might react with each other. Reactions to be avoided include highly exothermic or explosive reactions, such as produced by oxygen and hydrogen-bearing reactants, and reactions that produce particulate contamination of the chamber. The skilled artisan will recognize, however, that for certain sequential processes, other reactor designs can also be provided for achieving these ends, provided sufficient purge time is allowed to remove on the incompatible reactants.

FIG. 1 shows a chemical vapor deposition (CVD) reactor 10, including a quartz process or reaction chamber 12, constructed in accordance with a preferred embodiment, and for which the methods disclosed herein have particular utility. While originally designed to optimize epitaxial deposition of silicon on a single substrate at a time, the inventors have found the superior processing control to have utility in CVD of a number of different materials. Moreover, the illustrated reactor 10 can safely and cleanly accomplish oxidation, nitridation, and various anneal treatment steps in the same chamber 12, as will be apparent from the discussion of the preferred processes, discussed below. The basic configuration of the reactor 10 is available commercially under the trade name Epsilon® from ASM America, Inc. of Phoenix, Ariz.

A plurality of radiant heat sources are supported outside the chamber 12 to provide heat energy in the chamber 12 without appreciable absorption by the quartz chamber 12 walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, cleaning and prevention of contamination is often required in depositing layers on other substrates, including, without limitation, the deposition of optical thin films on glass or other substrates.

The illustrated support structure 18 includes a substrate holder 20, upon which the wafer 16 rests, and a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples are housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, slip ring 32 can reduce the risk of radial temperature non-uniformities across the wafer 16. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully with respect to FIG. 2, and communicates such gases with the slot 52 and the inlet port 40. The inlet 54 can include gas injectors as described in U.S. Pat. No. 5,221,556, issued Hawkins et al., or as described with respect to FIGS. 21–26 in U.S. patent application Ser. No. 08/637,616 filed Apr. 25, 1996, the disclosures of which are hereby incorporated by reference. Such injectors are designed to maximize uniformity of gas flow for the single-wafer reactor.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for low pressure processing.

The preferred reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TR-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the generation 60 and thence into the reaction chamber 12.

Wafers are preferably passed from a handling chamber (not shown), which is isolated from the surrounding environment, through the slot 52 by a pick-up device. The handling chamber and the processing chamber 12 are preferably separated by a gate valve (not shown) of the type disclosed in U.S. Pat. No. 4,828,224, the disclosure of which is hereby incorporated herein by reference.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 32, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300 mm wafer processing chamber has a total volume of about 24 liters, with an effective processing gas capacity of about 11.83 liters.

Figure 2:
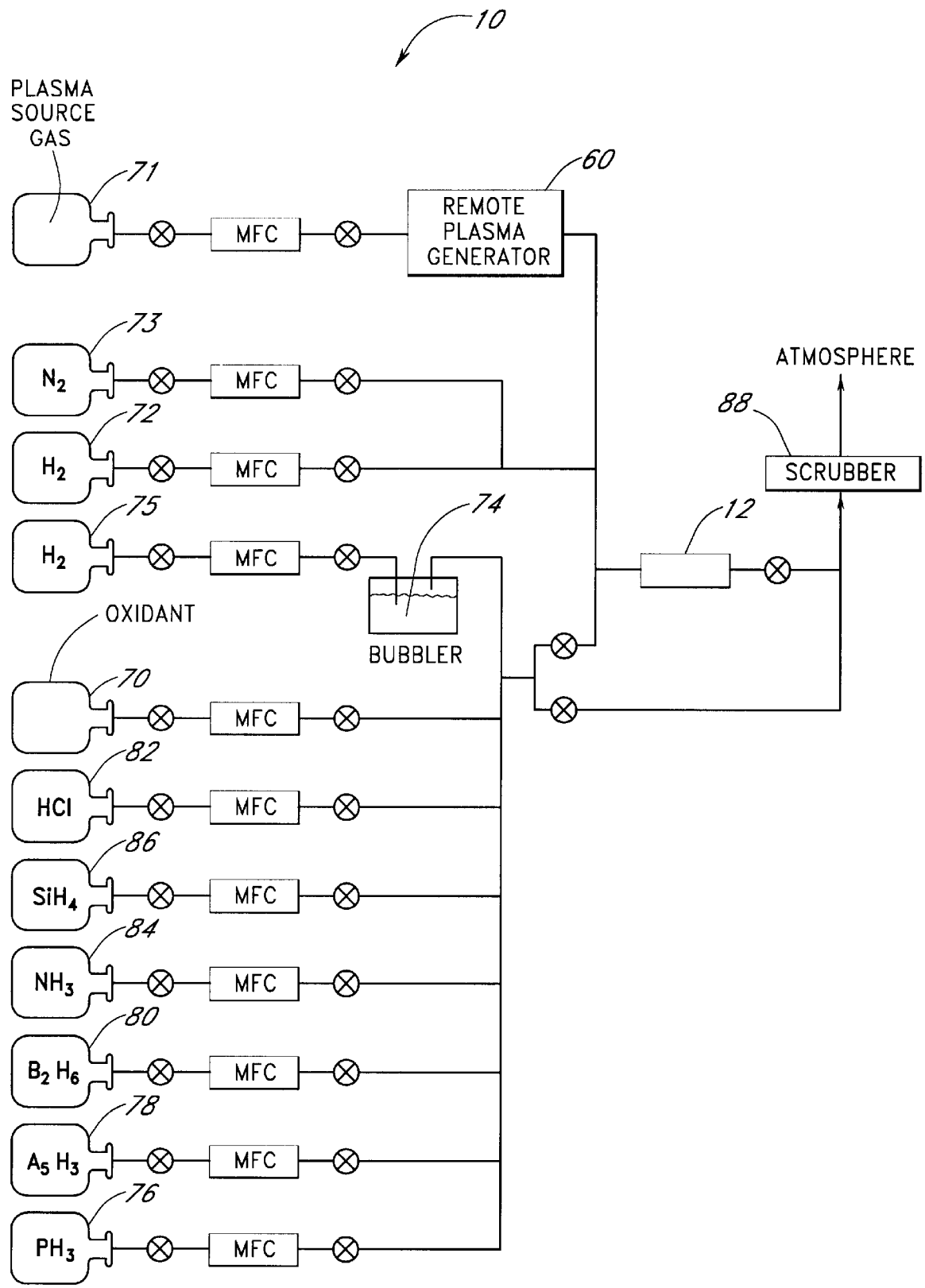
FIG. 2 is a gas flow schematic, illustrating reactant and purge gas sources in accordance with a preferred embodiment of the present invention.

FIG. 2 shows a gas line schematic, in accordance with the preferred embodiment. The reactor 10 is provided with a source 70 of oxidizing agent or oxidant. The oxidant source 70 can comprise any of a number of known oxidants, particularly a volatile oxidant such as $O_2$, NO, $H_2O$, $N_2O$, HCOOH, $HClO_3$. In Examples 1–3, set forth below, $N_2O$ or NO is most preferably employed. Example 4 employs pure oxygen gas ($O_2$) as well as NO, thus employing two oxidant sources at different points in the process flow. Preferably, the oxidant is introduced in an inert carrier gas flow, such as $H_2$ or $N_2$. In other arrangements, pure reactant flows can also be used. In still other arrangements, an oxygen-containing source gas can be provided to a remote plasma generator to provide excited species for oxidation.

The lower limit for the percentage of oxidant depends upon its intended use and time acceptable for oxidation, but can be as low as 0.1%. For the illustrated processes, including the formation of oxide or oxynitride layers for high quality gate dielectrics, the oxidant source 70 should include at least about 1% by volume of the oxidant agent. More preferably, the oxidant source 70 includes at least 2% NO. Most preferably, the oxidant mixture 70 is as close as possible to the explosive limit for the given conditions without exceeding it. Accordingly, the oxidant source for the preferred reactor conditions preferably comprises less than about 6% NO in a mixture with a noble gas, and particularly between about 1% and 5% NO. Alternatively, up to pure oxidant can be diluted with carrier gas, or employed in conjunction with other safety features to minimize risk of explosive interaction with reducing agents.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition. In Example 2, below, $H_2$ is also employed in a high temperature hydrogen bake to sublimate native oxide prior to layer formation. $H_2$ can also flow through the excited species generator 60 to generate H radicals for similar surface preparation. Further, element 71 provides the remote plasma generator 60 with a plasma source gas.

The preferred reactor 10 also includes a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

A liquid reactant source 74 is also shown. The liquid source 74 can comprise, for example, liquid dichlorosilane (DCS), trichlorosilane (TCS), or metallorganic sources in a bubbler, and a gas line for bubbling and carrying vapor phase reactants 75 from the bubbler to the reaction chamber 12. In Example 4, below, the bubbler holds liquid $Ta(OC_2H_5)_5$ as a metal source, while a gas line serves to bubble $H_2$ through the liquid metal source and transport metallorganic precurors to the reaction chamber 12 in gaseous form.

Desirably, the reactor 10 will also include other source gases such as dopant sources (e.g., the illustrated phosphine 76, arsine 78 and diborane 80 sources) and etchants for cleaning the reactor walls and other internal components (e.g., HCl source 82 or $NF_3/Cl_2$ (not shown) provided through the excited species generator 60). While not shown, a source of germanium (e.g., germane or $GeH_4$) can also be provided for doping or formation of SiGe films.

Additional illustrated source gases include an ammonia ($NH_3$) source 84, which serves as a volatile nitrogen source, useful in CVD and nitridation anneal steps, as will be apparent from Examples 1–4, set forth below. A silane source 86 is also provided. As is known in the art, silanes, including monosilane ($SiH_4$), DCS and TCS, are common volatile silicon sources for CVD applications, such as the deposition of silicon nitride, metal silicides, and extrinsic or intrinsic silicon (polycrystalline, amorphous or epitaxial, depending upon deposition parameters). Monosilane is particularly preferred to avoid chlorine incorporation into sensitive gate dielectric structures.

Each of the gas sources may be connected to the inlet 54 (FIG. 1) via gas lines with attendant safety and control valves, as well as mass flow controllers ("MFCs"), which are coordinated at a gas panel. Process gases are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber 88 to condense environmentally dangerous fumes before exhausting to the atmosphere.

In addition to the conventional gas sources and liquid bubblers, discussed above, the preferred reactor 10 includes the excited species source 60 positioned remotely or upstream of the reaction chamber 12. The illustrated source 60 couples microwave energy to gas flowing in an applicator, where the gas includes reactant precursors from the reactant source 63. A plasma is ignited within the applicator, and excited species are carried toward the chamber 12. Preferably, of the excited species generated by the source 60, overly reactive ionic species substantially recombine prior to entry into the chamber 12. On the other hand, radicals such as H, N and O survive to enter the chamber 12 and react as appropriate. As will be clear from the general process discussion below, and from the exemplary radical-enhanced processes of Examples 5 and 6, remote plasma-generated excited species facilitate higher quality layers as well as greater wafer throughput.

In situ Processing

Figure 3:
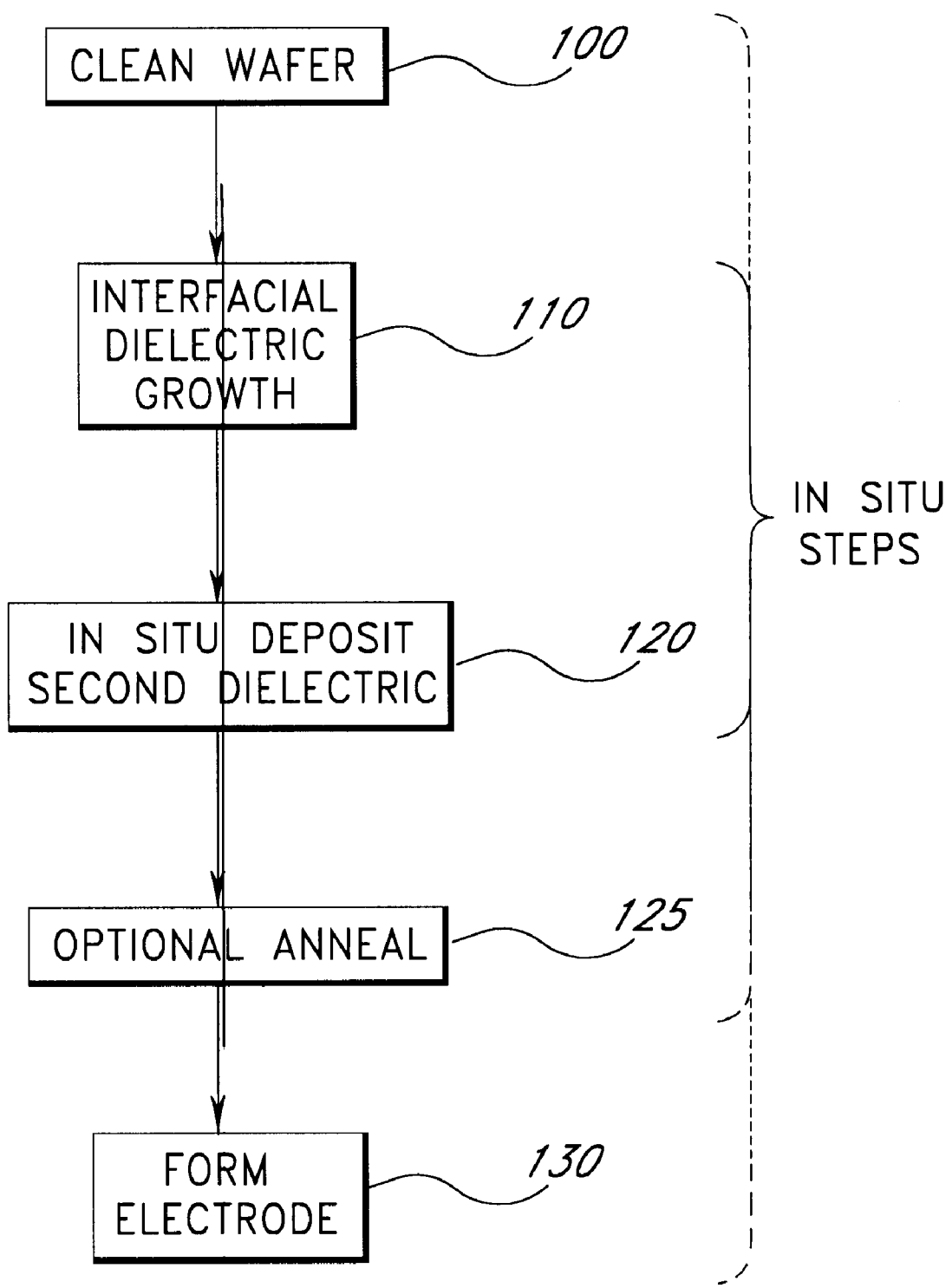
FIG. 3 is a flow chart generally showing steps for treating substrates in accordance with the preferred embodiments.

FIG. 3 shows a general process sequence in accordance with the invention. As illustrated, a single substrate, including a semiconductor structure, is cleaned 100 to remove contaminants and naturally occurring or native oxide on the semiconductor structure. The semiconductor structure can comprise, among other things, an epitaxial silicon layer or the top surface of a monolithic silicon layer. Conventionally, wafer cleaning prior to gate oxide growth is conducted prior to loading the wafer into the process chamber, and Examples 1–4 and 6 set forth below incorporate such conventional ex situ cleaning. For example, wafers may be cleaned in an SC1/HF wet etch bath. Alternatively, an integrated HF and acetic acid vapor clean can be conducted in a neighboring module within a cluster tool, reducing transport time and opportunity for recontamination or reoxidation. For some applications, the cleaning oxide left by the SC1 step is not removed, but is instead used as the initial oxide layer.

Figure 10:
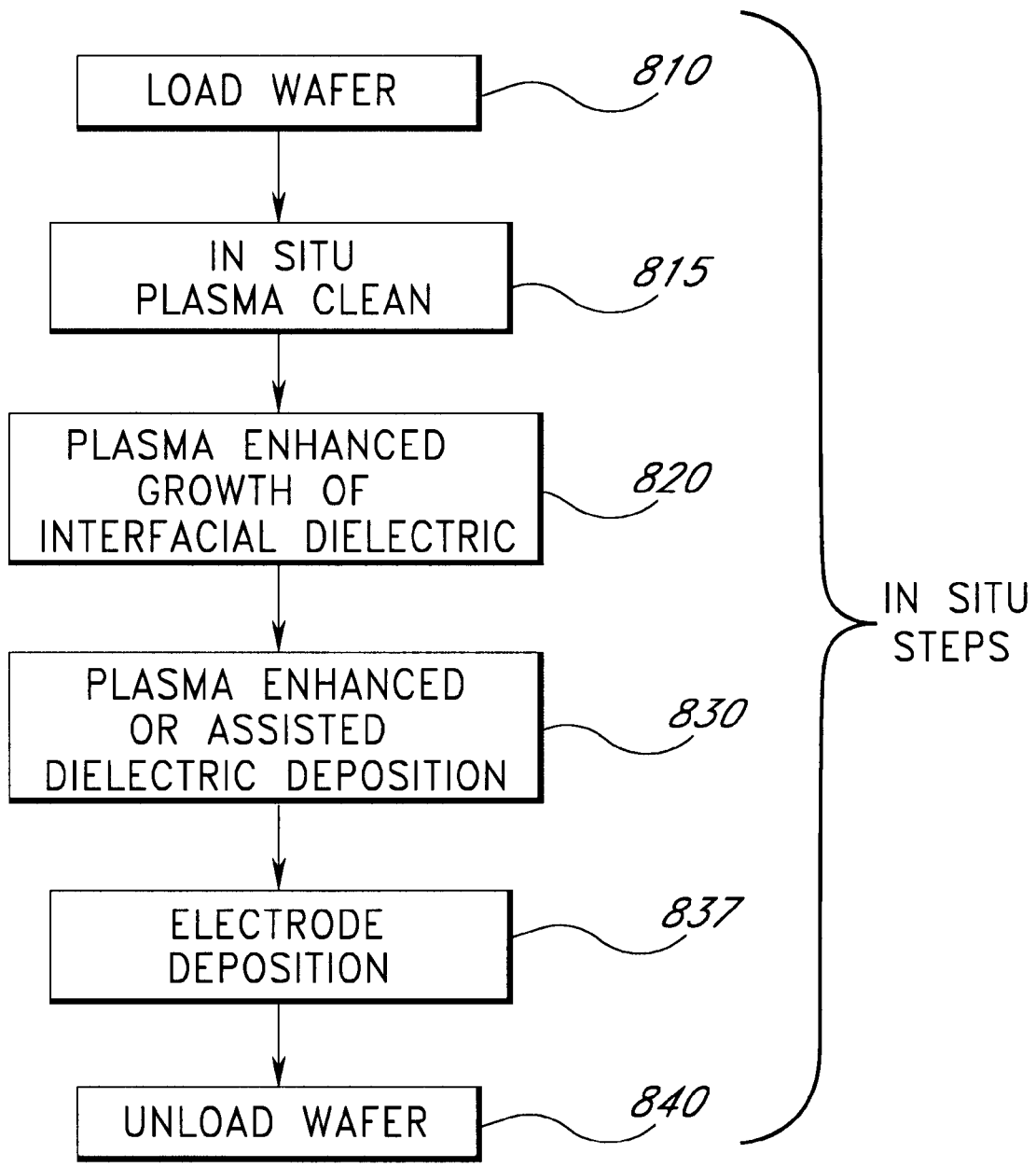

In accordance with one aspect of the invention, however, wafer precleaning can be performed partially or entirely in situ prior to the dielectric growth 110. As set forth in Example 2 below, a hydrogen bake step can be conducted within the chamber 12 to sublimate native oxide. Small amounts of HCl vapor can be added to this step to aid in cleaning metal contaminants and the like during the hydrogen bake. In another arrangement, plasma products can assist or conduct in situ cleaning, such as by substituting H radicals for hydrogen gas. Example 5 and FIG. 10 illustrates in situ cleaning with the aid of radicals generated by the remote plasma source 60 (FIG. 2). Advantageously, use of activated or excited species can widen the process temperature window for adequate cleaning.

Either after ex situ cleaning, or prior to in situ cleaning, the wafer or other substrate is loaded into the process chamber. Following cleaning, an interfacial dielectric is grown 110 over the substrate. Dielectric growth can be performed by exposure to a species reactive with the cleaned semiconductor structure, such as in thermal oxidation or nitridation. Because it is grown from the substrate, the interfacial dielectric layer is compatible with the semiconductor substrate, serving to prevent interface charge trapping sites. For this function, the layer can be very thin (e.g., one or two monolayers) and, as such, is typically not stoichiometric.

In the embodiments of Examples 1–4 below, the interfacial dielectric includes an oxide grown by thermal oxidation of the cleaned substrate, most preferably also including nitrogen incorporation (e.g., by oxidation with NO or $N_2O$) to form an oxynitride interfacial dielectric. Examples 5 and 6 advantageously provide nitrogen and/or oxygen radicals for oxide, nitride or oxynitride growth. Thus, the first dielectric layer preferably comprises $SiO_x$, $SiN_y$, or $SiO_xN_y$. The interfacial dielectric can also be formed by sequential processes, such as initial oxidation followed by nitridation or vice versa.

Without removing the wafer from the process chamber, dielectric growth 110 is followed by deposition 120 of a second dielectric layer, preferably by CVD. Most preferably, the dielectric growth and deposition steps are conducted under substantially isothermal and/or isobaric conditions. With respect to temperature, the processes are preferably conducted within about 100° C. of one another, more preferably within about ±50° C., and most preferably within about ±10° C. With respect to pressure, the processes are preferably conducted within about 200 Torr of one another, more preferably within about ±50 Torr, and most preferably without about ±20 Torr. In the illustrated embodiments, e.g., silicon oxynitride growth at a first temperature is followed by silicon nitride deposition within ±1° C. and ±1 Torr. It will be understood that the temperatures set forth above refer to setpoint temperature rather than actual temperature, which may vary slightly. However, the illustrated reactor 10 exhibits excellent temperature control, such that variation between setpoint and actual temperature is minimal. Similarly, pressure differences are target differences which do not account for inadvertent fluctuations.

In the illustrated Examples 1–3, dielectric growth and deposition steps are both preferably conducted in situ between about 700° C. and 850° C., more preferably between about 760° C. and 800° C., and most preferably at about 780° C. Pressure during the processes is preferably maintained between about 1 Torr and 80 Torr, more preferably at about 50 Torr. In Example 4, temperature is lowered from about 780° C. during an interfacial dielectric growth to about 450° C. during a high k dielectric deposition. In Example 5, oxygen and nitrogen radicals permit interfacial dielectric growth at about 680° C. followed by silicon nitride deposition at about 650° C. In Example 6, temperatures throughout dielectric formation (interfacial dielectric growth and further dielectric deposition) and electrode formation (silicon deposition) are preferably maintained between about 600° C. and 800° C., more preferably between about 650° C. and 700° C., and most preferably at about 680° C.

Desirably, the second dielectric layer has a higher dielectric constant than silicon oxide. In Examples 1–3 below, the second layer comprises a stoichiometric or near-stoichiometric silicon nitride layer ($Si_3N_4$) formed by CVD reaction of a nitrogen source gas and a silicon source gas, preferably ammonia and silane. The second layer thus contributes barrier characteristics and resistance to hot carrier effects, at the same time as enabling overall scaling of the gate dielectric due to a higher dielectric constant. Example 4 provides a dielectric stack where the deposited dielectric layer comprises tantalum oxide ($Ta_2O_5$), having a dielectric constant ranging from 20–40. This layer thus completes a capacitor dielectric with good interface properties and lends high capacitance per unit area to the capacitor structure.

Following dielectric deposition 120, the second or deposited dielectric layer is optionally annealed 125 to improve the quality of this layer. The process flow of Example 2 includes a high temperature ammonia ($NH_3$) anneal, serving to densify the deposited silicon nitride layer by reacting any excess silicon and producing a more stoichiometric $Si_3N_4$ layer. In other arrangements, an oxidant (e.g., $N_2O$, NO, $O_2$ or O radicals) is provided during the anneal 125. In still other arrangements, the anneal 125 includes exposure to a nitriding agent (e.g., $NH_3$, $N_2$ or N radicals) followed by exposure to an oxidant. In Example 4, the high k $Ta_2O_5$ layer is optionally subjected to a high temperature oxygen anneal, crystallizing the layer and filling any oxygen vacancies which might otherwise leave essentially metallic leakage paths.

The illustrated reactor 10 (FIGS. 1 and 2), with a low residence time, laminar flow design, minimizes the risk of trapped reactants and aids rapid purging between steps. The reactor design thus enables performing hydrogen, ammonia or oxygen anneal steps in situ while minimizing the risk of explosive or otherwise undesirable reaction among sequential reactants. Alternatively, the wafer can be temporarily removed to a wafer handling chamber adjacent the process chamber 12 while residue from the CVD process is cleaned from the process chamber walls, thus avoiding oxidation of the residue.

As shown in FIG. 3, dielectric deposition is followed by formation 130 of an electrode. In Examples 1–3 the electrode comprises a transistor gate electrode (see FIG. 4A), while Example 4 employs a capacitor reference electrode over the dielectric stack (see FIG. 5A). Advantageously, the illustrated reactor also permits electrode formation 130 in situ, as illustrated by Example 5. Accordingly, not only can a dielectric stack be formed in situ, but the preferred reactor and methods enable in situ processing of all steps illustrated in FIG. 3, as will be understood from the exemplary processes below.

Thus, as shown in FIG. 3, interfacial dielectric growth 110 and second dielectric deposition 120 are conducted in situ in each of the illustrations set forth in Examples 1–6 and FIGS. 6 to 11. Optionally, however, any or all of wafer cleaning 100, annealing 125 and forming electrodes 130 can also be conducted in situ, that is, without removing the wafer from the process chamber between steps.

In conducting in situ processing as described herein, the chamber need not be cleaned between processing steps. In fact, for many of the illustrative processes, the chamber need only be cleaned after processing several wafers. For example, a chamber cleaning or "chamber etch" cycle can be conducted after processing about 25 wafers in accordance with Example 1. Where electrode deposition is included within the process flow, such as Example 3, chamber cleaning can be conducted after processing about 10 or so wafers. Accordingly, wafer throughput can be even further improved.

Moreover, the advantages of isothermal processing can also be applied to chamber cleaning. Where the chamber 12 (FIG. 1) and other internal components include silicon deposits, HCl can be provided to a chamber between wafers, preferably at between about 500° C. and 800° C., more preferably at about the same temperature as the process temperature during in situ processing of the previous wafer. Such isothermal processing and chamber clean steps save the time of a separate temperature ramp. Furthermore, this helps reduce thermal stress on the reactor 10 components and eventually on the deposited layers, that might otherwise peel and create a potential source of particles and contamination for the chamber and wafers.

A process combining the species $NF_3$ and $Cl_2$ at a temperature in the range of 20° C. to 800° C., and preferably 500° C. to 800° C., and at a pressure compatible with the remote plasma generator working range (typically 0.5 to 5 Torr for this process) can be performed in order to remove deposited layers formed of silicon, silicon nitride, silicon oxynitride and/or silicon dioxide. $NF_3$ and $Cl_2$ are dissociated when flowing through the remote plasma generator 60 (FIG. 2) by applying about 850 W of microwave energy. Typically, 200 sccm $NF_3$, 400 scm $Cl_2$ and 4 to 10 slm $N_2$ flow through the remote plasma generator 60. The $N_2$ flow helps increasing the etch rate and increase the overall gas velocity. The $NF_3:Cl_2$ flow ratio and the temperature can be adjusted in order to increase the selectivity of the silicon nitride etch versus silicon dioxide, eventually to infinite, such that the silicon dioxide is untouched by the etch. Further details are provided in Suto et al, "Highly selective etching of $Si_3N_4$ to $SiO_2$ employing fluorine and chlorine atoms generated by microwave discharge", J. ELECTROCHEMICAL SOCIETY, Vol. 136, No 7, July 1989, p. 2032–2034; and Staffa et al, "Selective remote plasma etching of $Si_3N_4$ over $SiO_2$ at elevated temperature", ELECTROCHEMICAL SOCIETY PROCEEDINGS, Vol. 95-5, p. 283–289, the disclosures of which are incorporated herein by reference. Typically, high etch rates (e.g., 100 nm–1,000 nm per minute) of silicon and $Si_3N_4$ can be achieved with a temperature range of about 600° C. to 800° C.

Exemplary Processes

Throughout the following discussion of exemplary processes, identification of a target temperature (rather than a range) is meant to include a range of about ±20° C. on either side. Similarly, recitation of a target pressure should be read to include a range of about ±30 Torr.

Gate Dielectric Stacks

Examples 1–3 and 5–6 set forth processes for constructing dielectric stacks that are particularly suitable for transistor gate dielectric application.

Figure 4A:
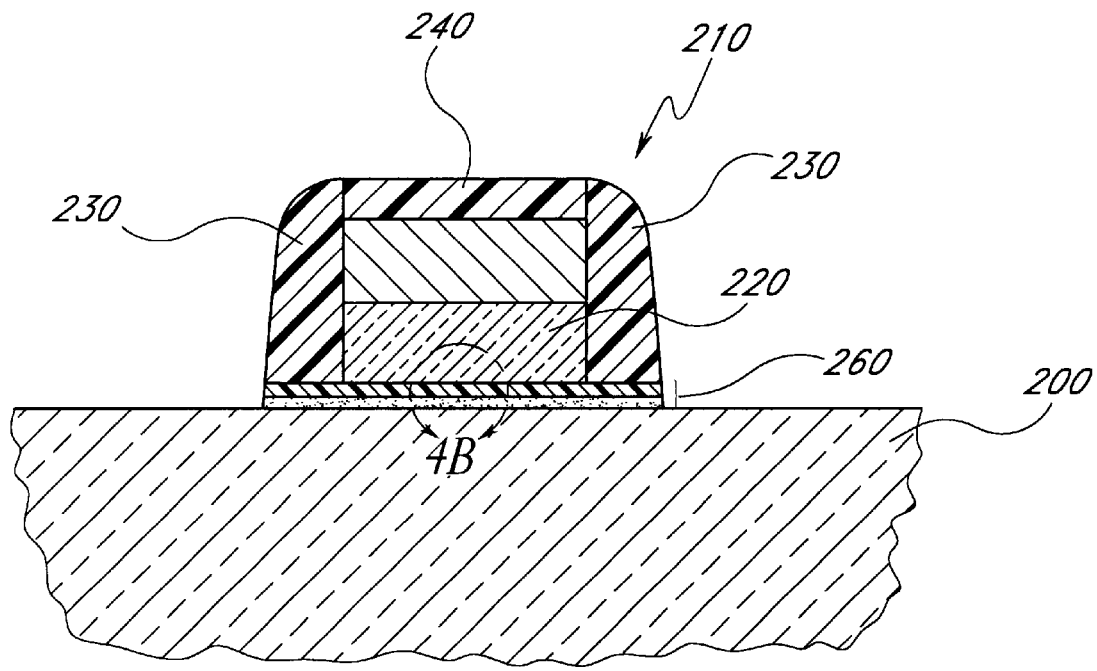
FIGS. 4A and 4B are schematic sections of a transistor gate stack constructed in accordance with preferred embodiments of the invention.
Figure 4B:
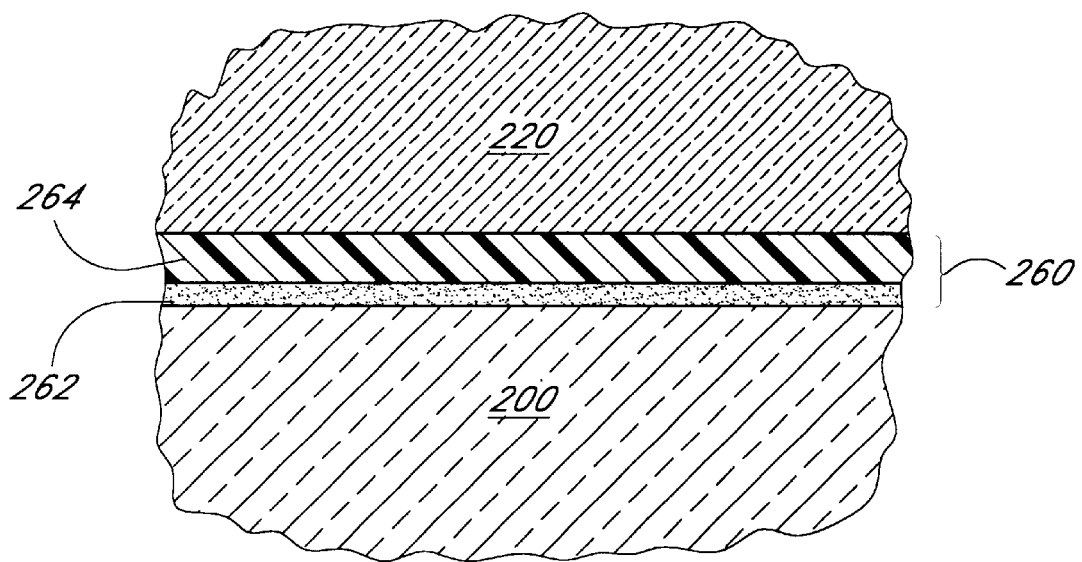

FIGS. 4A and 4B illustrate a transistor gate incorporating such a dielectric stack. In particular, a semiconductor substrate 200 is shown with a transistor gate stack 210 formed thereover. In the illustrated embodiment, the substrate 200 comprises an upper portion of a single-crystal silicon wafer, though the skilled artisan will appreciate that the substrate can also comprise other semiconductor materials.

The gate stack 210 includes a polysilicon electrode layer 220, with sidewall spacers 230 and a cap layer 240 protecting and isolating the electrode 220 in a conventional manner. Also illustrated is a more highly conductive strapping layer 250, typically including metal, over the polysilicon 220. The strap 250 facilitates rapid signal propagation among transistor gates across the wafer, connecting the gates to logic circuits.

A gate dielectric 260, formed by the exemplary processes described below, separates the gate electrode 220 from the substrate 200. As noted in the Background section above, the gate dielectric 260 is a critical feature in the pursuit of denser and faster circuits.

As best seen from the enlarged view of FIG. 4B, the preferred gate dielectric 260 comprises a dielectric stack, specifically a bilayer structure. An interfacial dielectric layer 262 directly overlies the silicon substrate 200, and is preferably formed by thermal oxidation and/or nitridation. A second dielectric layer 264 directly overlies the interfacial dielectric layer 262, and is preferably formed by chemical vapor deposition.

Exemplary methods of forming the illustrated gate structure will now be described in detail.

EXAMPLE 1

Figure 6:
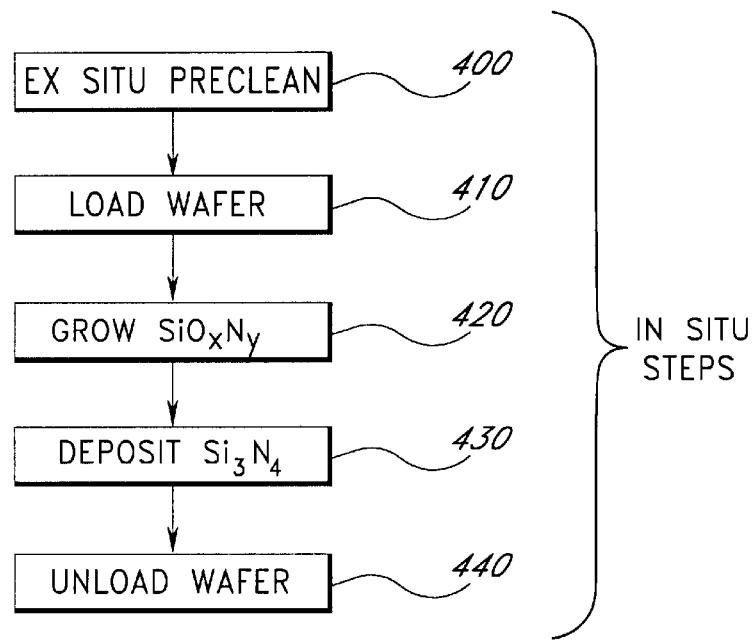
FIGS. 6–11 are flow charts showing steps for exemplary processes in accordance with the preferred embodiments.

Referring to FIG. 6, in accordance with a first exemplary process, the wafer is first cleaned 400 ex situ, such as in SC1 and HF baths to provide a clean silicon surface. As will be appreciated by the skilled artisan, the SC1 bath includes a dilute ammonium hydroxide and hydrogen peroxide aqueous solution. Alternatively, in a cluster tool system with multiple process modules connected to a common wafer handler, the substrate can be cleaned in a neighboring module with HF and acetic acid vapor treatment. In the latter case, the wafer is then transported through the wafer handler to the process chamber illustrated in FIG. 1 without exposing the substrate to the "clean room" outside the cluster tool, reducing exposure to oxygen or other contaminants prior to loading.

The wafer is next loaded 410 into the preferred reaction chamber 12 (FIG. 1) and the gate valve is closed. The reactor preferably idles at about 780° C. as the wafer is loaded 410. After loading, the wafer temperature stabilizes while the pump evacuates the process chamber down to about 50 Torr. Nitrogen carrier gas ($N_2$) flows during pump down.

Next, interfacial oxide is grown 420 by introduction of about 1.5 slm NO gas while maintaining a 15 slm flow of $N_2$, assuming pure NO oxidant gas. The skilled artisan will understand that the flow rate may need adjustment for use of alternative oxidant gases (e.g., $O_2$, $H_2O$, $N_2O$, HCOOH, $HCl_3$, mixtures or diluted oxidants). Temperature and pressure are maintained at about 780° C. and 50 Torr, respectively, and the $N_2$ flow is similarly maintained. In about 20 seconds, a layer of silicon oxynitride grows from the substrate to a thickness of about 0.5 nm.

Following oxide or oxynitride growth 420, the NO gas flow is stopped and the chamber is purged with $N_2$ by continued flow thereof. In general, the purge step involves flowing greater than about 2 chamber volumes of purge gas through the process chamber. A short purge time is facilitated by the low residence time of laminar flowing gas in the illustrated chamber 12 (FIG. 1). In either case, transition is considerably reduced relative to removing the wafer and transporting it to a second chamber.

Next, about 1.5 slm ammonia ($NH_3$) and 15 sccm silane ($SiH_4$) are introduced. Nitrogen continues to flow at the same flow rate, and temperature and pressure are maintained at about 780° C. and 50 Torr. Ammonia and silane flow are continued for about 90 seconds, reacting at the substrate surface to deposit 430 a layer of silicon nitride with a thickness of about 3 nm. As measured by ellipsometry in test depositions of thicker nitride layers without the interfacial oxide, nitride formed by a similar process has a refractive index of about 1.98, indicating a dense, stoichiometric $Si_3N_4$ film, exhibiting excellent barrier properties and resistance to threshold voltage wearout.

Following CVD of silicon nitride 430, the wafer is unloaded 440 and a new wafer loaded. Advantageously, the reactor is maintained at about 780° C. during the load/unload. Accordingly, the reactor is kept at a temperature setpoint of about 780° C. throughout the process, minimizing temperature ramping and stabilization both during the process as well as upon unloading 440 and loading 400 a new wafer.

While not illustrated, if a pure silicon oxide layer is first grown 420, the grown silicon oxide surface is optionally nitrided prior to deposition 430 of the nitride layer. For example, ammonia or N radicals can be introduced without further reactants. In another arrangement, N radicals can first nitride the silicon surface, followed by oxide growth through the thin nitride, such as by NO, $N_2O$, $O_2$ or O radicals.

Total process time for the oxide (or oxynitride) growth 420 and nitride deposition 430 is thus less than about 125 seconds for the illustrated gate dielectric stack. In the preferred reactor, with superior temperature control and susceptor, total elapsed time between loading 410 and unloading 440 the wafer is less than about 220 seconds, including temperature stabilization upon loading 400.

EXAMPLE 2

Figure 7:
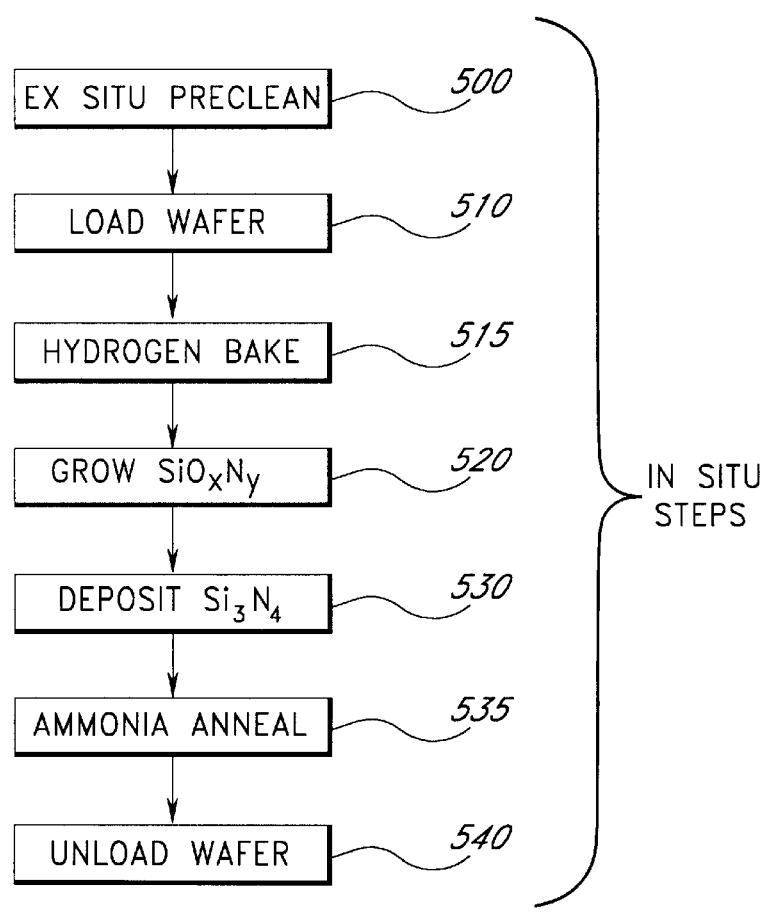

Referring to FIG. 7, in accordance with a second exemplary process, the substrate is also precleaned 500 ex situ, such as by SC1 and HF baths. Upon introduction to the reaction chamber, however, the chamber heating system idles at about 900° C. After loading 510 the wafer, the chamber pressure is set to about 50 Torr while the setpoint temperature is increased to about 900° C. Rather than $N_2$, $H_2$ gas flows through the chamber at a rate of about 15 slm. A hydrogen bake step 515 is conducted for about 60 seconds. Temperature stability is not critical for a hydrogen bake, such that this step 515 is preferably conducted simultaneously with temperature stabilization, such that no additional time is required. Advantageously, $H_2$ can be provided with greater purity than $N_2$. Furthermore, high temperature exposure of the substrate to $H_2$ causes sublimation of any native oxide during this additional in situ preclean step.

As will be understood from the disclosure herein, the $H_2$ bake can be replaced by provision of activated or excited H radicals. Advantageously, excited species can reduce the thermal energy needs of this in situ clean, such that the time required and energy required for temperature ramping can be reduced. Viewed from another perspective, the process window for the hydrogen bake can be widened by employing hydrogen radicals. Accordingly, in situ processing can be speeded by close to isothermal conditions throughout multiple steps. Typically, a reduced pressure (e.g., 2–5 Torr) is employed in conjunction with remote plasma generators, such as the preferred TR-850 microwave radical generator from R3T GmbH of Munich, Germany.

Following the hydrogen bake 515, the wafer is cooled to about 780° C., which consumes about 60 seconds in the illustrated reactor, while pressure is maintained at about 50 Torr. A dielectric stack, comprising interfacial oxynitride and overlying silicon nitride, is then formed 520, 530 on the clean substrate surface, desirably under the same isothermal and isobaric process parameters set forth in Example 1.

Following formation 520, 530 of the dielectric stack, an in situ anneal 535 serves to densify the silicon nitride layer. In the illustrated embodiment, silane flow is stopped while nitrogen and ammonia flow are maintained at the same flow rate as during nitride deposition. Preferably after silane is fully purged from the chamber, wafer temperature is ramped from 780° C. to about 900° C. (consuming about 10 seconds for the preferred reactor) and the anneal 535 maintained for about 60 seconds. Advantageously, the wafer is unloaded 540 while the reactor continues to idle at about 900° C., such that, upon unloading the old and loading a new wafer, the new wafer quickly reaches temperature stability. In other arrangements, however, an oxidant (e.g., $N_2O$, NO, $O_2$ or O radicals) is instead provided during the anneal 535. In still other arrangements, the anneal 535 includes exposure to a nitriding agent (e.g., $NH_3$, $N_2$ or N radicals) followed by exposure to an oxidant.

Total elapsed time for the portion of the second exemplary in situ process, including hydrogen pre-bake 515, dielectric stack formation 520, 530 and post-deposition nitrogen anneal 535, is less than about 214 seconds.

EXAMPLE 3

Figure 8:
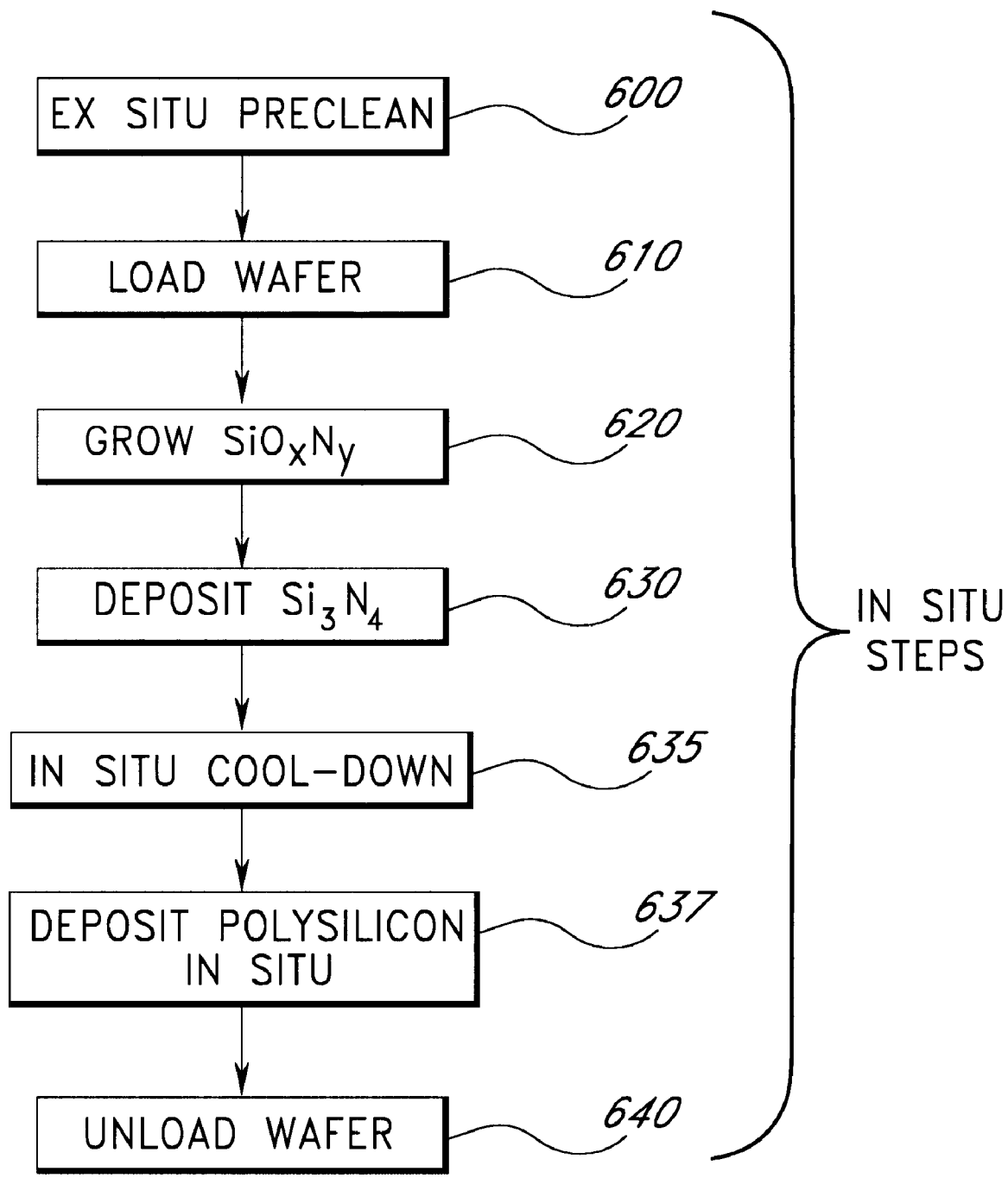

Referring to FIG. 8, in accordance with a third exemplary process, a gate stack is grown 620 and deposited 630 in accordance with Examples 1 or 2 (Example 1 is shown), set forth above. Prior to unloading 640 the wafer, however, a conductive layer is formed 637 in situ over the dielectric stack. In the illustrated embodiment, the conductive layer comprises a polysilicon or silicon germanium (poly-SiGe) gate electrode layer, such as the gate electrode layer 220 in FIGS. 4A and 4B.

Following nitride deposition 630 at 780° C. (or post-deposition anneal), the wafer is preferably cooled 635 to about 680° C. while $N_2$ or $H_2$ purge gas continue to flow. As is known in the art, cool down within this temperature range is typically slow, relative to cool down from 1,100° C. to 900° C., for example. Accordingly, cool down 635 is preferably hastened by moving the wafer proximate a cold chamber wall, or by moving a cold element in proximity to the wafer. Preferred structures and methods for such rapid, in situ cool down 635 are disclosed in co-pending U.S. application Ser. No. 09/150,986, filed Sep. 10, 1998 and entitled METHOD AND APPARATUS FOR FAST COOL-DOWN OF SEMICONDUCTOR WAFERS, the disclosure of which is incorporated herein by reference.

Where $N_2$ purge is utilized during cool down 635, the $N_2$ flow is maintained at about 15 slm while about 350 sccm silane is introduced. Employing disilane can advantageously improve deposition rates. Pressure continues to be maintained at about 50 Torr, and the temperature held steady at about 680° C. Within about 120 seconds, a polysilicon electrode layer of about 150 nm is deposited 637. It will be understood that the polysilicon formed by this method would be doped for appropriate conductivity after deposition 637, though in situ doping (during deposition) is also contemplated. For in situ doping, common doping sources such as phosphine, arsine or diborane can be added to the silane flow. In another arrangement, the chamber can be backfilled to about atmospheric pressure for an $H_2/SiH_4$ polysilicon process.

In still other arrangements, the polysilicon layer is in situ doped with germanium in order to lower the electrical workfunction at the gate/dielectric interface. For example, a germane (1.5% in $H_2$) flow of about 100 sccm to 1,000 sccm can be added to the silane flow. In this case, the temperature of the deposition is preferably maintained between about 550° C. and 650° C., more preferably at about 600° C. ±15° C. A germanium content in the resulting poly-SiGe layer is about 10% to 60%.

Capacitor Dielectric Stacks

Figure 9:
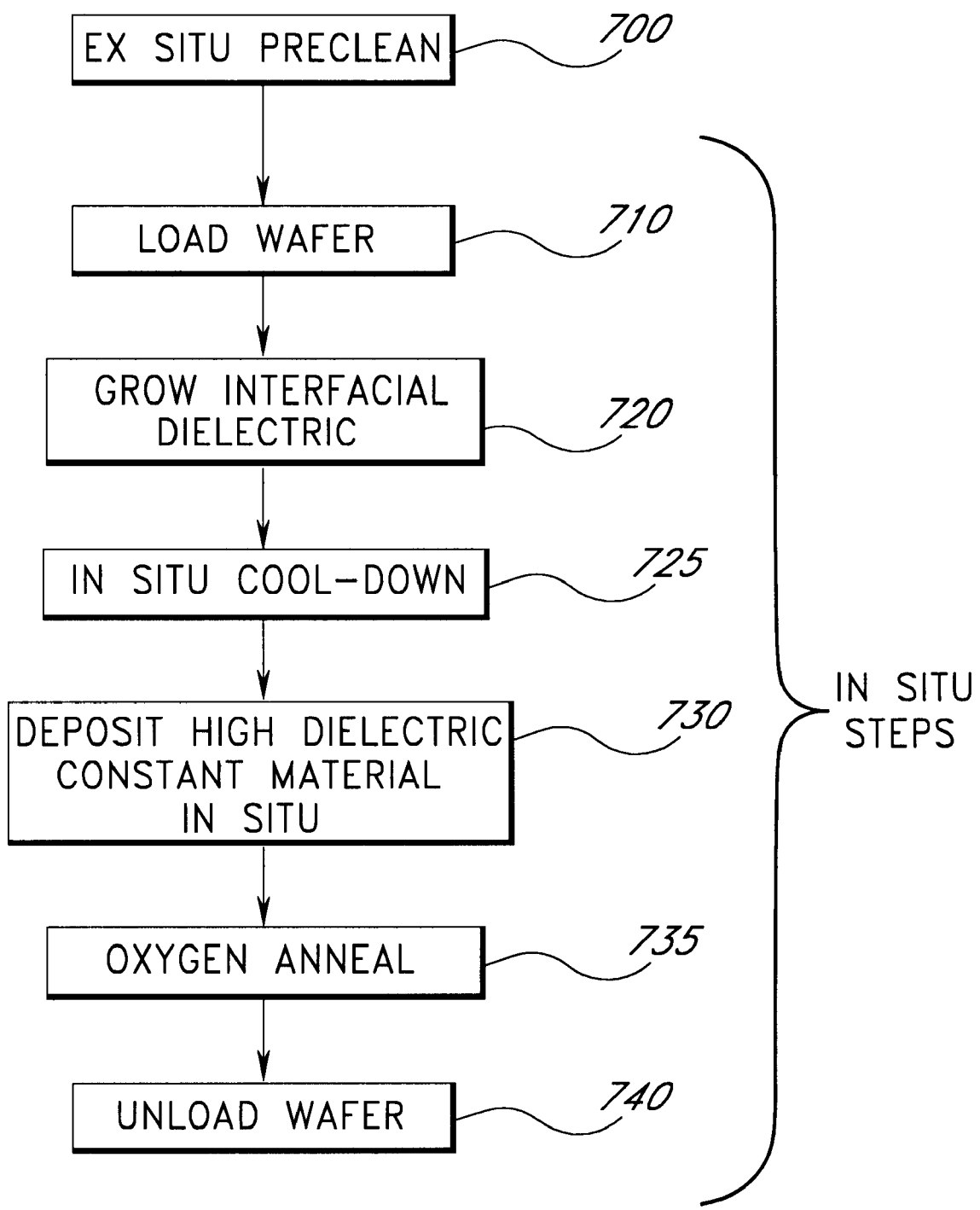

Referring to FIG. 9, a fourth exemplary process for constructing a dielectric stack is shown, particularly suitable for integrated capacitors. Example 4 is set forth in detail below after a discussion of an exemplary capacitor structure.

Figure 5A:
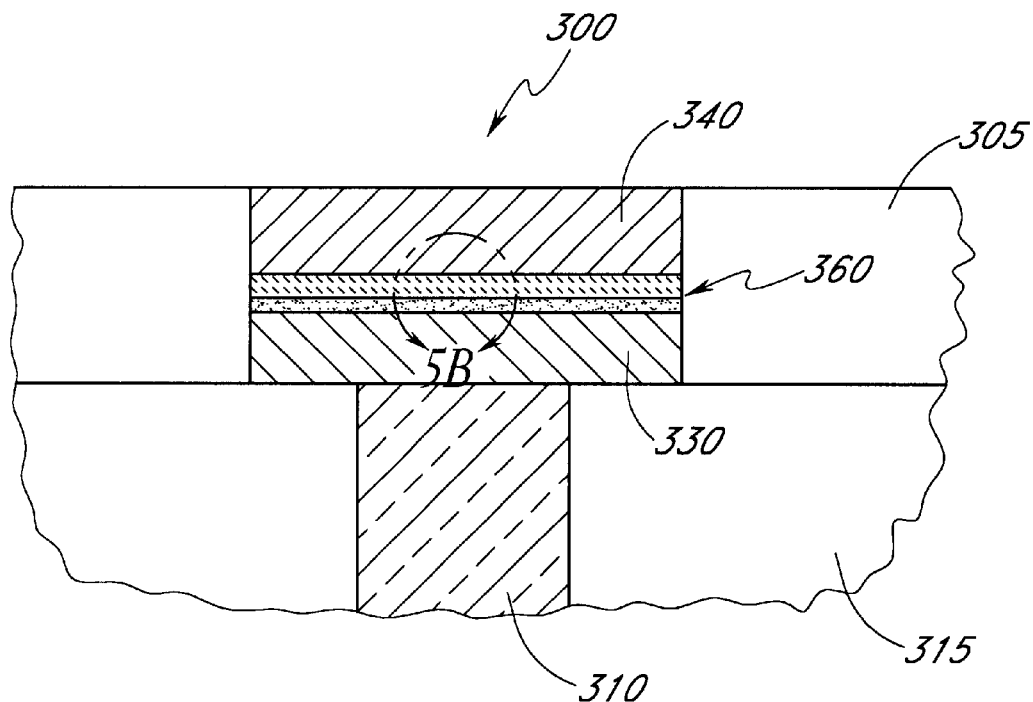
FIGS. 5A and 5B are schematic sections of an integrated capacitor constructed in accordance with another preferred embodiment of the invention.
Figure 5B:
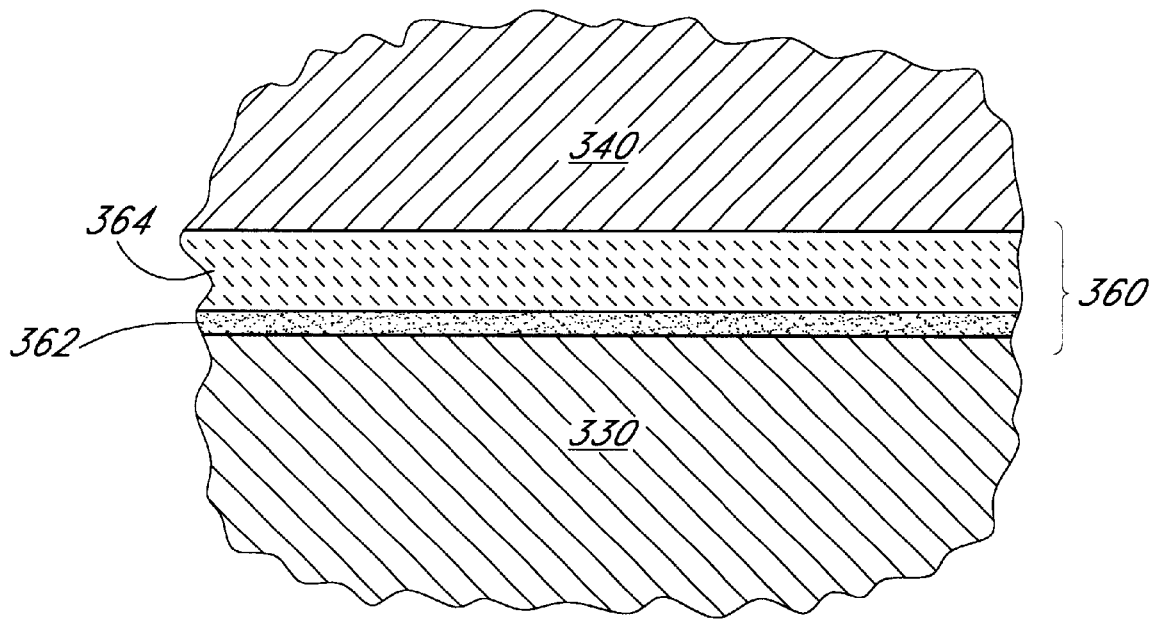

FIGS. 5A and 5B illustrate an integrated capacitor 300 incorporating such a dielectric stack. In particular, the capacitor 300 is typically latched to a transistor active area (not shown). As the illustrated capacitor 300 is a "stacked" capacitor, i.e., formed above the substrate, an upper insulating layer 305 surrounds the capacitor, and electrical connection is formed by way of a contact plug 310 extending through a lower insulating layer 315. The plug 310 typically comprises polysilicon, tungsten or other conformal metal. The skilled artisan will appreciate that, in other arrangements, memory cell capacitors are formed in deep trenches within the substrate, rather than above the substrate, and that electrical connection is otherwise formed for such designs.

The capacitor 300 comprises a lower or storage electrode 330, in electrical contact with a transistor active area by way of the contact plug 310, and an upper or reference electrode 340. In accordance with Example 4, the lower electrode 330 comprises a material from which a nitride or oxide layer, preferably an insulating layer, can be grown.

The electrodes 330, 340 are separated by a capacitor dielectric 360. As is known in the art, the capacitor dielectric 360 strongly influences the storage capacity, or capacitance, of the device. Capacitance is proportional to the capacitor dielectric's effective dielectric constant k, and is inversely proportional to the thickness of the dielectric capacitor 360.

As best seen from FIG. 5B, the illustrated capacitor dielectric 360 comprises a dielectric stack, specifically a bilayer structure. A first dielectric layer 362 directly overlies the lower electrode 330, and is preferably grown from the underlying electrode 330 (e.g., by thermal oxidation and/or nitridation). A second dielectric layer 364 directly overlies the first dielectric layer 362, and is preferably formed by chemical vapor deposition.

The skilled artisan will readily appreciate, from the foregoing description and the process set forth below, that the lower electrode 330 comprises a conductive material which is oxidized or nitrided to form an interfacial nitride, oxide or oxynitride. In the illustrated embodiment, the lower electrode comprises polysilicon, which can be oxidized to form silicon oxide, nitrided to form silicon nitride or exposed to both oxygen and nitrogen (simultaneously or in sequence) to form silicon oxynitride. Other candidate materials include non-noble metals such as tungsten, titanium, tantalum, etc. Note that, for the illustrated capacitor application, the grown material serves mainly to form a suitable interfacial buffer to improve the quality of a later-deposited dielectric, and need not be insulating itself. If a grown metal oxide or metal nitride is conductive, it can serve as part of the lower electrode, rather than part of the dielectric.

An exemplary method of forming the illustrated capacitor dielectric stack 360 will now be described in detail.

EXAMPLE 4

Referring again to FIG. 9, a fourth exemplary process is provided for dielectric stack formation for incorporation into a memory cell capacitor. As with Examples 1–3, a wafer is precleaned ex situ and loaded into the chamber, which is set to about 780° C. and 50 Torr with 15 slm $N_2$ flowing.

In contrast to the previous examples, however, the wafer has been previously fabricated to the point of defining a lower electrode for a memory cell capacitor. The electrode surface is then thermally oxidized, preferably by additional flow of about 1.5 slm NO for about 20 seconds. A thin (e.g., about 0.5 nm) interfacial dielectric, comprising silicon oxynitride, is thus grown 720.

Following thermal oxidation 720, the temperature of the substrate is lowered 725 from 780° C. to about 450° C. The methods and structures of U.S. application Ser. No. 09/150, 986, incorporated by reference hereinabove, preferably facilitate such rapid in situ cooling 725.

A material having a higher dielectric constant than silicon oxide is thereafter deposited 730 in situ over the oxynitride layer, preferably by CVD. For example, silicon nitride can be deposited by the methods set forth herein. In the exemplary process, however, tantalum oxide ($Ta_2O_5$) forms by flowing a metallorganic precursor in an oxidizing ambient. In particular, 1 slm $N_2$ gas is bubbled through liquid source $Ta(OC_2H_5)_6$, which is desirably maintained at about 160° C., facilitating vaporization. At the same time, an oxidizing environment is maintained in the chamber, preferably formed by high volume (e.g., 15 slm) $O_2$ gas flow. About 5–10 nm of tantalum oxide is deposited 730.

Following deposition, the oxidizing environment is preferably maintained during a post-deposition curing anneal 735. In one arrangement, the temperature is ramped from the deposition temperature to about 780° C., and the oxygen flow maintained for about 30 seconds. In another arrangement, O radicals are provided to enable a lower temperature oxidation anneal 735. As previously noted, the oxidation anneal 735 densifies the high dielectric layer.

Advantageously, the substrate is unloaded 740 while the reactor continues to idle at about 780° C. such that, upon unloading 740 and loading a new wafer, the new wafer quickly reaches temperature stability.

The total elapsed time between loading 710 and unloading 740 for the fourth exemplary process, including post-deposition anneal, is less than about 400 seconds.

Remote Plasma Enhanced Sequential Processing

Examples 5 and 6 below illustrate in situ processing facilitated by use of the remote plasma source 60, described above with respect to FIG. 2. As will be apparent from the previous embodiments, in situ processing is facilitated and performed more quickly by conducting isothermal sequential processes. In this way, temperature ramp time is minimized or eliminated altogether. Moreover, purity of the process is improved by minimizing thermal stresses, which may cause peeling of coatings from the substrate or from the walls of the chamber itself. In arrangements where pressure can be maintained throughout the in situ processes, time for backfill or evacuation is minimized, and process purity is improved by minimizing pressure fluctuations which can also induce flaking and other particulate generation.

In accordance with an aspect of the invention, isothermal and isobaric processing is further facilitated by adding the energy of excited species to processing reactions, thereby widening the process window. A wider range of temperature and pressure conditions is thereby available, depending upon the relative amount of plasma energy employed.

It is well known that plasma enhancement can lower reaction temperatures for CVD and chemical etching processes. Conventionally, this knowledge has been employed to lower processing temperatures solely to conserve thermal budgets. The present embodiment, however, makes use of the flexibility enabled by the added parameters of a remote plasma that delivers excited species to the process chamber. Energy input by excited species into a first process, for example, can be tailored to lower the process temperature to match that of a second process, thereby enabling isothermal sequential processing. Accordingly, overall time savings can be achieved by reduction of temperature ramp time. Similarly, when conducting isobaric processes, evacuation or backfill time between steps is avoided.

In addition to widening process windows to facilitate in situ processing, provision of a remote plasma entails independent advantages for gate dielectric layers. Provision of activated radical species enables a reduction of undesirable reaction by-products.

For example, CVD of silicon nitride conventionally involves the reaction of a volatile silicon source, such as dichlorosilane (DCS), with a volatile nitrogen source, such as ammonia ($NH_3$), at relatively high temperatures. Unfortunately, chlorine and hydrogen incorporated into dielectric layers can negatively influence electrical properties, particularly for sensitive gate dielectric applications of recent high density integrated circuit designs.

As set forth in Example 5, however, employing a remote plasma facilitates elimination of chlorine from the process without adversely affecting deposition rates or conformality. Supply of N radicals lowers the thermal energy required for decomposition and reaction with the silicon source gas, such that $SiH_4$ can be employed as the silicon source, rather than the more volatile DCS. Additionally, hydrogen content can be significantly reduced by employment of excited nitrogen species in place of $NH_3$. Thus, conventional CVD reactants ($SiCl_2H_2+NH_3$) are replaced by reactants ($SiH_4+N$) with no chlorine and lower hydrogen content. As will be appreciated by the skilled artisan, a reduced hydrogen content can reduce leakage current through the dielectric at issue.

Additionally, a wider variety of processes can be conducted in situ. Example 5 lists four such processes (excluding load/unload) in sequence, three of which are selected for excited species enhancement. Example 6 lists three such processes (excluding load/unload) in sequence, two of which are selected for excited species enhancement. The skilled artisan will readily appreciate further processes facilitated or performed by radicals, which can safely and efficiently be conducted within the same process chamber. Furthermore, as will be better understood from Examples 5 and 6, isothermal processing can be facilitated by selection of parameters for the process with the most narrow process window and providing prior or subsequent processes with excited species to match those parameters.

EXAMPLE 5

Referring now to FIG. 10, the fifth exemplary process illustrates wafer cleaning, gate dielectric stack formation and gate electrode deposition, all conducted in sequence without removing the wafer from the preferred single-wafer processing chamber 12 (FIG. 1), i.e., all conducted in situ.

Preferably, the process engineer selects the process in the sequence that has the stringent parameter requirements. Polysilicon for the gate electrode, for example, should be deposited in a temperature range of about 600° C. to 800° C. in order to avoid amorphous and large grain structures and to obtain commercially acceptable throughput. Accordingly, setting the desired polysilicon deposition conditions as the target, one or more and preferably all of the remaining processes to be conducted in situ are conducted under similar or identical temperature and pressure. In the illustrated embodiment, polysilicon deposition is more preferably conducted between about 650° C. and 700° C., most preferably at about 680° C., with pressure preferably between about 1 Torr and 80 Torr, more preferably 50 Torr. Therefore, the remaining processes are preferably selected for deposition within about ±100° C. of the polysilicon deposition parameters. More preferably, parameters for the various processes are kept within about ±50° C. and most preferably within about ±10° C. Ideally, setpoint temperature are kept within ±1° C., such that temperatures need not be ramped between in situ steps.

Initially, the wafer to be processed is loaded 810 into the process chamber. Desirably, the reactor idles at about 680° C., such that the lamps and susceptor both transfer thermal energy to the wafer until the chamber is evacuated to about 50 Torr.

In situ wafer cleaning 815 is conducted after loading 810, preferably by introduction of excited species. In the illustrated embodiment, hydrogen and/or fluorine radicals aid in the cleaning the wafer prior to dielectric growth. As will be understood by the skilled artisan, any suitable fluorine source gas can be supplied and subjected to ionizing energy in the remote plasma generator 60 (FIG. 2). For example, $NF_3$, HF, $F_2$, $ClF_3$, etc. are readily dissociated in the generator to supply fluorine radicals. It has been found, however, that under appropriate conditions enough F radicals can be generated by thermal energy supplied to fluorine source gas (e.g., $NF_3$) in the chamber itself, such as by the heated susceptor. Excited fluorine species effectively etch native oxide (e.g., about 10 Å–15 Å) from the wafer surface, at the same time cleaning contaminants such as carbon and metal. Moreover, fluorine radicals (whether generated by plasma energy or thermally dissociated) can also be employed to induce etching of chamber wall coatings.

More preferably, H radicals are provided to enhance cleaning by sublimation of native oxide. During an H radical clean, $H_2$ source gas can be supplied separately from the remote plasma products and the relative amounts of excited hydrogen species and hydrogen gas can be selected to tailor cleaning conditions. Most preferably, however, the relative amount of excited hydrogen species to compound gas is tailored by adjusting hydrogen source gas flow rate and ionizing energy through the remote plasma generator 60 (FIG. 2).

During the excited species clean 815, an inert or carrier gas preferably flows. For example, $N_2$ can flow at about 15 slm. The radical-assisted clean 815 is preferably conducted for about 30 seconds.

Interfacial dielectric growth 820 follows the plasma clean step. In other arrangements, the growth step may comprise thermal oxidation at about 780° C. with NO gas, as in the previous embodiments. In the illustrated embodiment, however, the process window is widened, thereby bringing parameters closer to the preceding and subsequent in situ steps, by the introduction of O or N radicals, O then N radicals, or N then O radicals.

Specifically, dielectric growth 820 is accomplished by shutting the flow of cleaning plasma, which is quickly purged by high volume $H_2$ or $N_2$ flow (preferably $N_2$ due to the subsequent oxidation step). $O_2$ gas is ionized in the remote plasma generator 60 (FIG. 2) and, by selective recombination of excited oxygen species, predominantly O radicals are introduced to the wafer. The wafer is preferably maintained below about 750° C., more preferably between about 650° C. and 700° C. Most preferably, the dielectric growth 820 is conducted at about 680° C., such that no temperature ramping is required between cleaning 815 and growth 820 steps. Similarly, the chamber is preferably maintained at about 50 Torr, such that no backfill or evacuation is required between cleaning 815 and growth 820 steps. Alternatively, $N_2$ gas can be activated and introduced to the wafer at about the same temperature and pressure, or both O and N excited species can grow silicon oxynitride. In any case, the temperature and pressure is maintained close to, and preferably the same as, that of preceding and subsequent processes.

Similarly, subsequent dielectric deposition 830 is aided by plasma energy to enable near isothermal sequential processing. In the illustrated embodiment, silicon nitride is deposited 830 over the grown dielectric. If the preceding growth 820 included oxygen plasma, oxygen flow is stopped and a flow of N radicals is provided or is continued. Due to the energy input by the supply of N radicals to the process, deposition can be conducted at about 650° C. to 680° C. Carrier gas flow continues while silane ($SiH_4$) is supplied. In the exemplary embodiment, about 1 sccm to 20 sccm of silane is provided while nitrogen radicals are provided by flowing about 1 slm to 10 slm $N_2$ through the plasma generator, where it is subjected to about 500 kW to 2,000 kW of microwave energy.

In other arrangements, $NH_3$ flow can be added to the N radical supply, such as to tailor the process conditions for a given deposition rate. Accordingly, the process parameters can be selected to match preceding or subsequent processes, minimizing transition time for temperature ramping, evacuation or backfill.

Whether or not ammonia is additionally supplied to the deposition 830, the substitution of excited nitrogen species for some or all of the ammonia can advantageously reduce hydrogen content in the deposited silicon nitride. The electrical characteristics of the gate dielectric are thereby improved. Furthermore, the use of silane in the plasma enhanced or assisted nitride deposition advantageously omits chlorine incorporation into the deposited dielectric, unlike deposition processes employing DCS or TCS, without sacrificing throughput.

An optional anneal (not shown) can follow nitride deposition, to densify the deposited 830 silicon nitride. Such an anneal can including nitriding agents (e.g. ammonia) and/or oxidants (e.g., $N_2O$). As will be understood from the foregoing disclosure, the temperature for this anneal can be lowered considerable by the injection of N radicals to the anneal environment, and is preferably conducted at about 680° C. in the illustrated process flow.

It will also be understood that alternative depositions can replace the illustrated nitride deposition. For example, in fabricating a dielectric stack for a memory cell capacitor, the deposited dielectric can comprise $Ta_2O_5$, as disclosed with respect to FIGS. 5A and 5B and Example 4 above. In this case, O radicals can be supplied to widen the process window, and similarly to aid an oxidation anneal step. Alternatively, the high dielectric constant material can be deposited by CVD, as disclosed with respect to Example 4, and the process windows of preceding and subsequent in situ processes are widened to closely conform to the stringent process parameters demanded by the $Ta_2O_5$ deposition.

Following deposition 830, the electrode layer can be deposited 837 in situ, as illustrated. Preferably, the electrode deposition 837 comprises CVD at about 680° C. and 50 Torr, as disclosed with respect to Example 3 above. In other arrangements, polysilicon can be deposited under atmospheric conditions. As noted with respect to Example 3, the electrode deposition can also include germanium doping. Since the preceding processes were assisted by remote plasma to match the processing conditions for the polysilicon deposition, conventional CVD is employed without resort to plasma enhancement or assist. It will be understood that, in other arrangements, the process window for deposition of polysilicon or other electrode material can be widened by providing excited species to match the parameters of other more difficult processes.

The wafer is then unloaded 840, and the next wafer loaded. Advantageously, with minimal or no temperature ramping and pressure change, cleaning 815, interfacial dielectric growth 820, dielectric deposition 830 and electrode deposition 837 can all be conducted in less than about 400 seconds. Widening process windows by injection of remotely generated plasma reactant facilitates such isothermal and isobaric processing. Fabrication time and therefore cost is considerably reduced without commensurate reduction in reaction rate.

EXAMPLE 6

Figure 11:
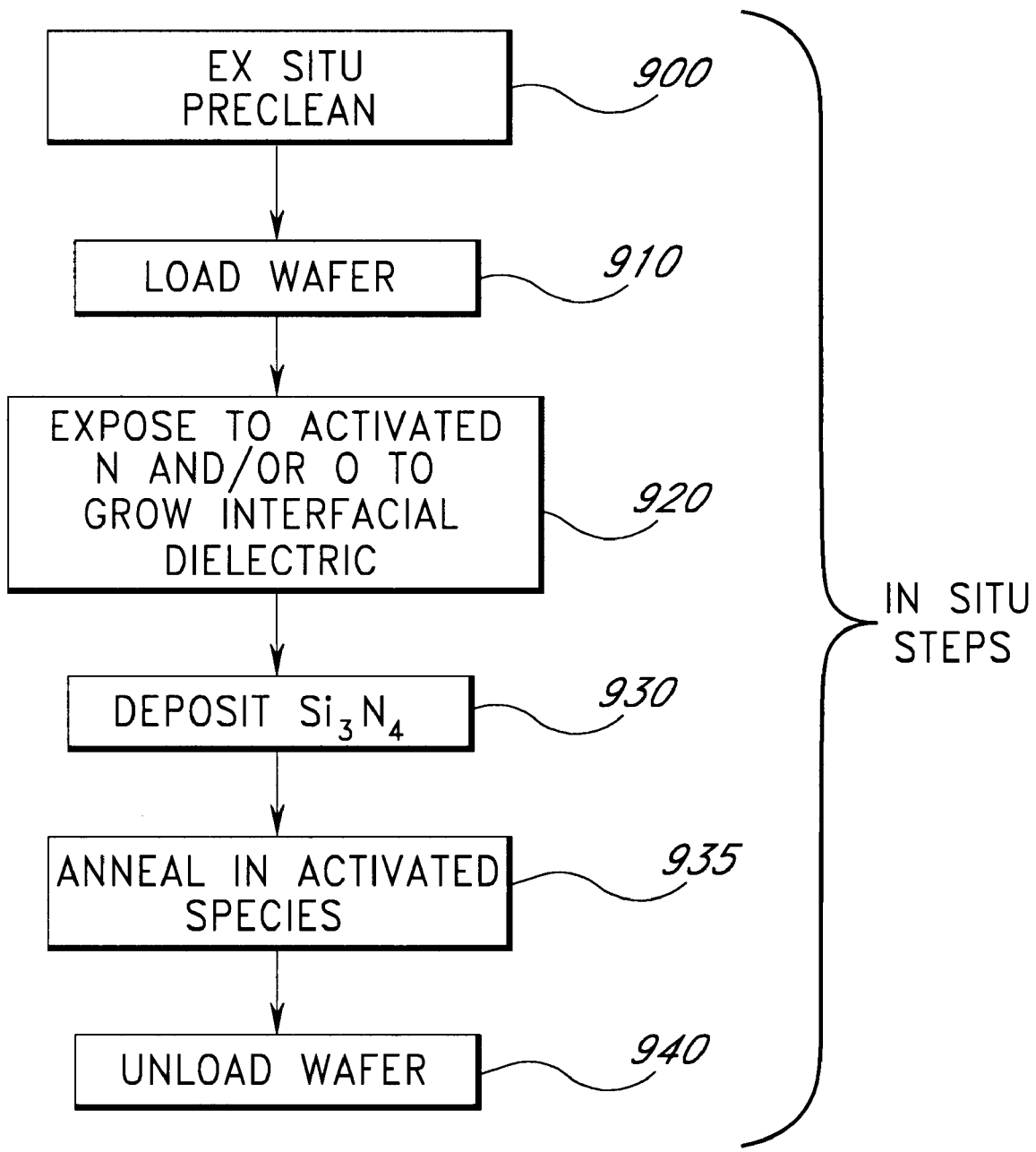

Referring now to FIG. 11, a sixth exemplary process illustrates wafer cleaning, gate dielectric stack formation and gate electrode deposition, all conducted in sequence without removing the wafer from the preferred single-wafer processing chamber 12 (FIG. 1), i.e., all conducted in situ.

Preferably, the process engineer selects the process in the sequence that has the stringent parameter requirements. In the illustrated sequence, silicon nitride deposition 930 by CVD has the most stringent parameter requirements. Most preferably, ammonia and silane flow with wafer temperature at about 780° C. and 50 Torr. Therefore, the remaining processes are preferably selected for deposition within about ±100° C. and ±200 Torr of the silicon nitride deposition parameters. More preferably, parameters for the various processes are kept within about ±50° C. and ±50 Torr, and most preferably within about ±10° C. and ±20 Torr. Ideally, setpoint temperature and target pressures are kept within ±1° C. and ±1 Torr, such that temperatures need not be ramped, and the chamber need not be evacuated or backfilled between in situ steps.

After ex situ clean 900, the wafer to be processed is loaded 910 into the process chamber. Desirably, the reactor idles at about 780° C., such that the lamps and susceptor both transfer thermal energy to the wafer until the chamber is evacuated to about 55 Torr.

Interfacial dielectric growth 920 follows wafer loading 910. While the temperature and pressure are maintained at about 780° C. and 50 Torr, nitrogen and/or oxygen excited species are introduced to the wafer. $O_2$ gas is ionized in the remote plasma generator 60 (FIG. 2) and introduced to the wafer. $N_2$ gas can alternatively be ionized and introduced to the wafer at about the same temperature and pressure, or both O and N excited species can grow silicon oxynitride, either simultaneously or in sequence. In any case, the temperature and pressure is maintained close to, and preferably the same as, that of preceding and subsequent processes.

Similarly, a subsequent dielectric deposition 930 can be performed as described with respect to Example 1 above, at about 780° C. and 50 Torr.

A nitrogen anneal 935 follows nitride deposition 930, to densify the deposited silicon nitride. Advantageously, the temperature for this anneal is preferably conducted at about 780° C., facilitated by the injection of N radicals to the anneal environment. In other arrangements, wherein the deposited dielectric is a high k oxide (see Example 4), the anneal can benefit from an injection of O radicals to widen the process window.

The wafer is then unloaded 940, and the next wafer loaded. Advantageously, with minimal or no temperature ramping, interfacial dielectric growth 920, dielectric deposition 930 and dielectric anneal 935 can all be deposited in less than about 400 seconds. Widening process windows by injection of remotely generated excited species facilitates such isothermal processing. Fabrication time and therefore cost is considerably reduced without commensurate reduction in reaction rate.

Advantages

In situ processing, in and of itself, is advantageous in reducing transition time between formation of the two dielectric layers, and is additionally advantageous in minimizing wafer movement and exposure of the wafer to potentially contaminating atmospheres. Conducting the processes in the preferred single pass, horizontal flow processing chamber enables maintenance of chamber purity and avoids undesirable reaction among reactants of the sequential processes through laminar gas flow and minimal reactant residence time.

Furthermore, throughput and purity of the in situ processing are even further improved in some embodiments by conducting the dielectric growth and subsequent dielectric deposition at about the same temperature, thus even further reducing transition time between processes. Accordingly, the transition time between growth of the first dielectric layer and deposition of the second dielectric layer is preferably kept to less than about 30 seconds, more preferably less than about 10 seconds, and most preferably is zero. Advantageously, the growth and deposition can also be performed rapidly. In the illustrated embodiments, total time elapsed for growth of an interfacial oxide and deposited dielectric layer is less than about 180 seconds, more preferably less than about 150 seconds, and most preferably less than about 120 seconds for an ultrathin gate dielectric.

The preferred isothermal processing is advantageous in many aspects. As noted, temperature ramp and stabilization time between steps is avoided. Moreover, chamber and wafer surfaces are subjected to less thermal cycling, which can stress and peel layers previously formed on such surfaces, contaminating both the chamber and the wafer supported therein. Such thermal stresses are particularly acute for in situ processes, where residue formed by a first step is not cleaned from chamber walls prior to the second step.

The illustrated embodiments also demonstrate the use of isobaric sequential processes. For example, each of Examples 1–4 include multiple in situ sequential processes, each of which are conducted at about 50 Torr. The chamber 12 thus need not be pumped up or down between steps. Not only do isobaric processes save the time required for vacuum pumping or backfill, but by doing so, they also avoid vibratory shock, non-laminar flow and consequent flaking and particulate generation.

Additionally, the illustrated reactor 12 further enables widening the process windows by providing excited species to the processes, as demonstrated by Examples 5 and 6. The widened process windows facilitate sequential processing at close to isothermal and/or isobaric conditions. As demonstrated by the exemplary process recipe, reactant radicals can be supplied in desired amounts and with appropriate energies at each step of a multiple step in situ process flow.

Advantageously, such processing assisted by excited species widens the process window for each step. In particular, the energy supplied in dissociation of reactants at the remote plasma generator 60 (FIG. 2) can effectively reduce thermal energy input required to dissociate reactants within the chamber. Together, energy input from plasma and from thermal sources (e.g., radiant heat lamps) supply the required reaction energy. In recognition of this fact, energy input through supply of a particular volume of a particular excited species can be selected to enable isothermal and isobaric sequential processes, despite different inherent energy requirements for the different processes. The use of a remote plasma source, in particular, facilitates isothermal and isobaric processing by widening the process window for each process.

It will be appreciated by those skilled in the art that various modifications and changes may be made without departing from the scope of the invention. For example, the skilled artisan will readily appreciate that widening process windows using excited species can be adapted to speed sequential processes in a variety of integrated circuit contexts, in addition to the gate dielectric and capacitor dielectric examples set forth herein. Similar other modifications and changes are intended to fall within the scope of the invention, as defined by the appended claims.

We claim:

1. A process for forming a gate dielectric stack for an integrated transistor, the method comprising:

loading a substrate having a semiconductor structure into a single substrate processing chamber;

growing an interfacial dielectric layer on a surface of the semiconductor structure within the chamber by exposure to a first gas reactive with the semiconductor structure; and depositing a silicon nitride layer in the same chamber over the interfacial dielectric layer by supplying excited nitrogen species and a silicon source to the substrate, wherein a hydrogen content of the excited nitrogen species and the silicon source is lower than a hydrogen content of silane and ammonia and wherein growing the interfacial dielectric layer and depositing the silicon nitride layer are performed under substantially isothermal conditions.

2. The process of claim 1, wherein growing the interfacial dielectric layer comprises growing a thermal oxide and incorporating nitrogen into the thermal oxide layer.

3. The process of claim 1, further comprising in situ annealing the nitride layer.

4. The process of claim 1, wherein a substrate temperature is maintained between about 700° C. and 850° C. during both interfacial dielectric growth and silicon nitride deposition.

5. The process of claim 4, wherein the substrate temperature is maintained between about 760° C. and 800° C. during both interfacial dielectric growth and silicon nitride deposition.

6. The process of claim 1, wherein a substrate temperature is maintained between about 650° C. and 700° C.

7. The process of claim 1, wherein growing the interfacial dielectric layer and depositing the silicon nitride layer are performed under isobaric conditions.

8. The process of claim 7, wherein a pressure in the chamber is maintained between about 1 Torr and 80 Torr.

9. The process of claim 1, wherein depositing the silicon nitride layer comprises a chemical vapor deposition.

10. The process of claim 9, wherein the hydrogen content of the deposited silicon nitride layer is lower than a hydrogen content of a silicon nitride layer deposited by thermal chemical vapor deposition using silane and ammonia.

11. The process of claim 9, wherein growing the interfacial dielectric layer and depositing the silicon nitride layer are performed under substantially isothermal and substantially isobaric conditions.

12. The process of claim 1, further comprising in situ cleaning the semiconductor structure prior to growing the interfacial dielectric.

13. The process of claim 12, wherein in situ cleaning comprises exposing the semiconductor structure to hydrogen species.

14. The process of claim 13, wherein the hydrogen species comprises hydrogen radicals.

15. A process of forming a gate dielectric stack for an integrated transistor, comprising:

growing a first dielectric layer from a semiconductor substrate in a single-substrate processing chamber; and depositing a second dielectric layer comprising silicon nitride over the first dielectric layer without removing the substrate from the processing chamber by supplying excited nitrogen species and a silicon source to the substrate, wherein a hydrogen content of the excited nitrogen species and the silicon source is lower than a total hydrogen content of silane and ammonia and wherein growing and depositing the second dielectric layer are performed under substantially isobaric conditions.

16. The process of claim 15, wherein the hydrogen content of the silicon nitride layer is lower than a hydrogen content of a silicon nitride layer deposited by thermal chemical vapor deposition using silane and ammonia.

17. The process of claim 15, wherein the second dielectric layer has a higher dielectric constant than the first dielectric layer.

18. The process of claim 15, wherein growing the first dielectric layer comprises thermally oxidizing the semiconductor substrate.

19. The process of claim 18, wherein growing the first dielectric layer comprises flowing an excited oxygen species.

20. The process of claim 18, wherein depositing the second dielectric layer comprises chemical vapor deposition.

21. The process of claim 20, wherein depositing the second dielectric layer is performed while maintaining the substrate at the same temperature as during the thermal oxidation.

22. The process of claim 15, wherein the second dielectric layer is deposited directly over the first dielectric layer.

23. The process of claim 15, further comprising nitriding the first dielectric layer prior to depositing the second dielectric layer.

24. The process of claim 23, wherein nitriding the first dielectric layer comprises exposing the first dielectric layer to an excited nitrogen species.

25. A method of forming an integrated transistor gate on a semiconductor substrate, comprising:

growing an oxide layer from the substrate at a first temperature; and depositing a silicon nitride layer over the oxide layer at a second temperature, the second temperature within about ±50° C. of the first temperature, wherein the silicon nitride layer is formed by supplying excited nitrogen species and a silicon source to the substrate, and wherein a total hydrogen content of the excited nitrogen species and the silicon source is lower than a total hydrogen content of conventional silicon nitride deposition reactants.

26. The method of claim 25, wherein the total hydrogen content of the excited nitrogen species and the silicon source is lower than a total hydrogen content of silane and ammonia.

27. The method of claim 25, wherein the hydrogen content of the silicon nitride layer is lower than a hydrogen content of a silicon nitride layer deposited by thermal chemical vapor deposition using silane and ammonia.

28. The method of claim 25, wherein the second temperature is within about ±10° C. of the first temperature.

29. The method of claim 28, wherein growing the oxide and depositing the silicon nitride layer are conducted in situ in a single-substrate processing chamber without removing the substrate from the chamber.

30. The method of claim 29, further comprising in situ depositing a polysilicon layer directly over the silicon nitride layer.

31. The method of claim 30, wherein depositing a polysilicon layer comprises maintaining the substrate at a third temperature within about ±50° C. of the second temperature.

32. The method of claim 30, wherein the polysilicon layer comprises germanium.

33. The method of claim 32, wherein a germanium content of the polysilicon film is between about 10% and 60%.

34. The method of claim 25, further comprising conducting a nitridation prior to depositing the silicon nitride layer.

35. The method of claim 34, wherein the nitridation is conducted prior to growing the oxide layer.

36. A method of sequential processing in a single chamber to partially fabricate an integrated circuit, the method comprising:

selecting a plurality of processing steps and a sequence to conduct the plurality of steps upon a substrate within the same chamber;

selecting a temperature for a base process from among the plurality of steps;

loading a substrate into the chamber;

conducting the base process upon the substrate; and remotely generating a plasma and providing a silicon source and an excited nitrogen species to the substrate at substantially the base process temperature during at least one of the plurality of the steps immediately preceding or immediately subsequent the base process in the selected sequence, wherein a hydrogen content of the provided silicon source and excited nitrogen species is lower than a total hydrogen content of silane and ammonia.

37. The method of claim 36, wherein a hydrogen content of a silicon nitride layer deposited by the provided silicon source and excited nitrogen species is lower than a hydrogen content of a silicon nitride layer deposited by thermal chemical vapor deposition using silane and ammonia.

38. The method of claim 36, wherein the base process comprises depositing a polysilicon layer and the plurality of steps further comprise:

growing an oxide from a semiconductor structure; and depositing a second dielectric layer over the oxide.

39. The method of claim 38, wherein each of depositing the polysilicon, growing the oxide and depositing the second dielectric layer are conducted within about ±50° C. of one another.

40. The method of claim 38, wherein depositing the polysilicon comprises doping the polysilicon layer with germanium.

41. The method of claim 36, wherein the excited species widens a process window for the at least one of the plurality of the steps, and the at least one of the plurality of the steps is conducted at a temperature closer to a base process temperature relative to the at least one of the plurality of the steps without the excited species.

42. A process for conducting a plurality of in situ integrated circuit fabrication steps, comprising:

mounting a substrate within a process chamber;

supplying a silicon source and a remotely generated excited nitrogen species to deposit a silicon nitride layer on the mounted substrate in a first substrate treatment step, and conducting the first step at a first temperature, wherein a hydrogen content of the deposited silicon nitride layer is lower than a hydrogen content of a silicon nitride layer deposited by thermal chemical vapor deposition using silane and ammonia; and conducting a second substrate treatment step, at a second temperature within about ±50° C. of the first temperature, without removing the substrate from the chamber and without the remotely generated plasma product.

43. The process of claim 42, wherein the first substrate treatment step comprises depositing silicon nitride and the second substrate treatment step comprises depositing polysilicon or silicon germanium by chemical vapor deposition.

44. The process of claim 42, wherein the first substrate treatment step is conducted prior to the second substrate treatment step.

45. The process of claim 44, wherein the second substrate treatment step immediately succeeds the first substrate treatment step.

* * * * *